(12) United States Patent
Peng et al.

(10) Patent No.: US 12,334,179 B2
(45) Date of Patent: Jun. 17, 2025

(54) CELL STRUCTURES AND POWER ROUTING FOR INTEGRATED CIRCUITS

(71) Applicant: Taiwan Semiconductor Manufacturing Company, Ltd., Hsinchu (TW)

(72) Inventors: Shih-Wei Peng, Hsinchu (TW); Jiann-Tyng Tzeng, Hsin Chu (TW); Kam-Tou Sio, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/447,788

(22) Filed: Aug. 10, 2023

(65) Prior Publication Data

US 2024/0055029 A1 Feb. 15, 2024

Related U.S. Application Data

(62) Division of application No. 17/127,091, filed on Dec. 18, 2020, now Pat. No. 11,908,538.

(60) Provisional application No. 62/982,321, filed on Feb. 27, 2020.

(51) Int. Cl.
*G11C 5/14* (2006.01)
*G11C 5/06* (2006.01)
*H01L 23/50* (2006.01)
*H01L 23/538* (2006.01)

(52) U.S. Cl.
CPC .......... *G11C 5/14* (2013.01); *G11C 5/06* (2013.01); *H01L 23/50* (2013.01); *H01L 23/5386* (2013.01)

(58) Field of Classification Search
CPC ........... G11C 5/14; G11C 5/06; G11C 5/025; G11C 11/412; H01L 23/50; H01L 23/5386; H01L 23/5286; H01L 27/0207; H10D 89/10
See application file for complete search history.

(56) References Cited

U.S. PATENT DOCUMENTS

| 5,986,961 | A  | * | 11/1999 | Igarashi | G11C 5/14 365/63 |
| 11,328,750 | B1 | * | 5/2022 | Amirante | H01L 23/535 |
| 2007/0097573 | A1 | * | 5/2007 | Agata | G11C 17/165 361/90 |
| 2009/0244948 | A1 | * | 10/2009 | Hung | G11C 5/14 365/51 |

(Continued)

*Primary Examiner* — S M Sohel Imtiaz
(74) *Attorney, Agent, or Firm* — Merchant & Gould P.C.

(57) ABSTRACT

Various memory cell structures and power routings for one or more cells in an integrated circuit are disclosed. In one embodiment, different metal layers are used for power stripes that are operable to connect to voltage sources to supply different voltage signals, which allows some or all of the power stripes to have a larger width. Additionally or alternatively, fewer metal stripes are used for signals in a metal layer to allow the power stripe in that metal layer to have a larger width. The larger width(s) in turn increases the total area of the power stripe(s) to reduce the IR drop across the power stripe. The various power routings include connecting metal pillars in one metal layer to a power stripe in another metal layer, and extending a metal stripe in one metal layer to provide additional connections to a power stripe in another metal layer.

20 Claims, 32 Drawing Sheets

(56) References Cited

U.S. PATENT DOCUMENTS

| | | | |
|---|---|---|---|
| 2013/0107651 A1* | 5/2013 | Singh | H03K 17/161 |
| | | | 365/207 |
| 2017/0104406 A1* | 4/2017 | Kim | G11C 5/148 |
| 2018/0025762 A1* | 1/2018 | Chun | G11C 8/08 |
| | | | 365/230.06 |
| 2019/0148284 A1* | 5/2019 | Aipperspach | G06F 30/30 |
| | | | 716/120 |
| 2020/0286831 A1* | 9/2020 | Shao | H01L 23/5286 |
| 2021/0083182 A1* | 3/2021 | Hara | H10B 63/80 |
| 2021/0134785 A1* | 5/2021 | Yang | H01L 23/528 |

\* cited by examiner

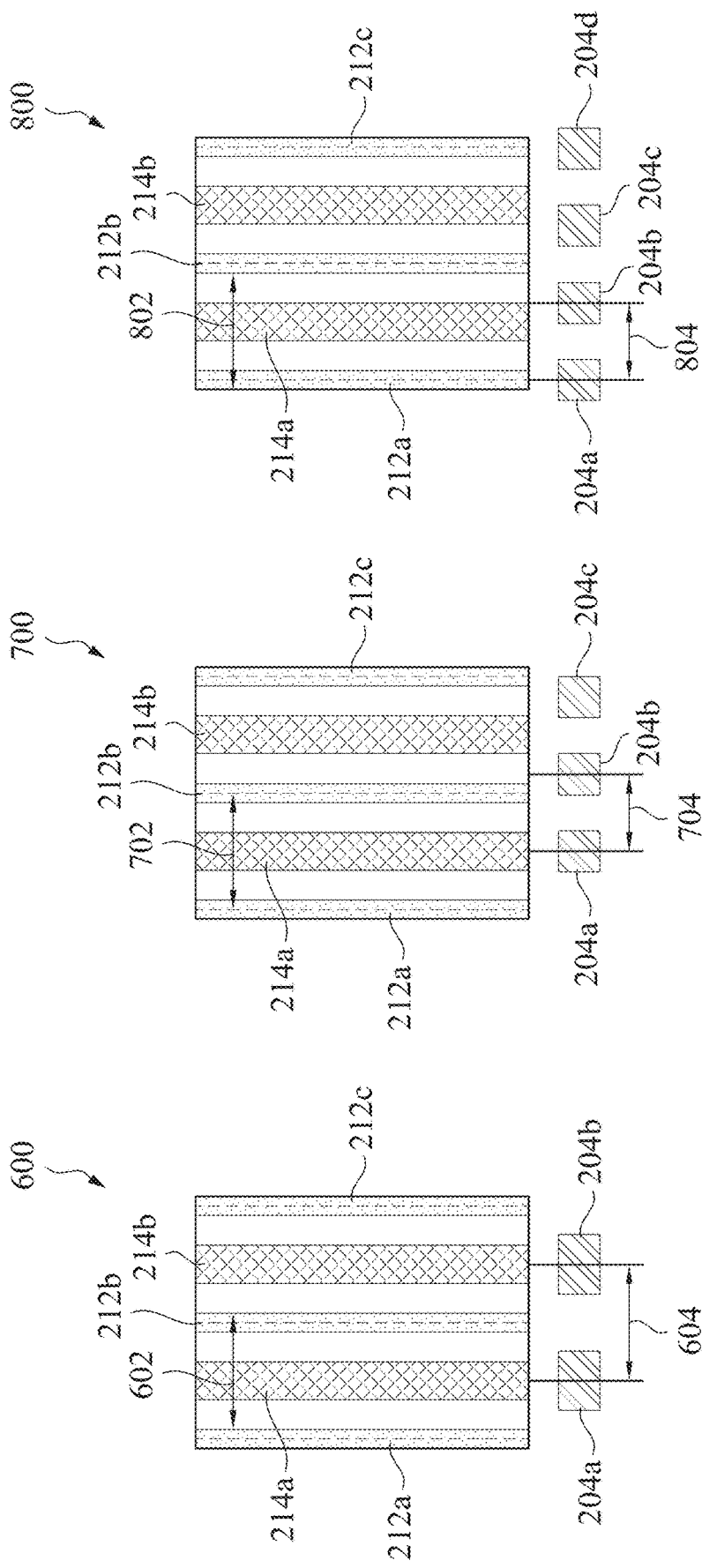

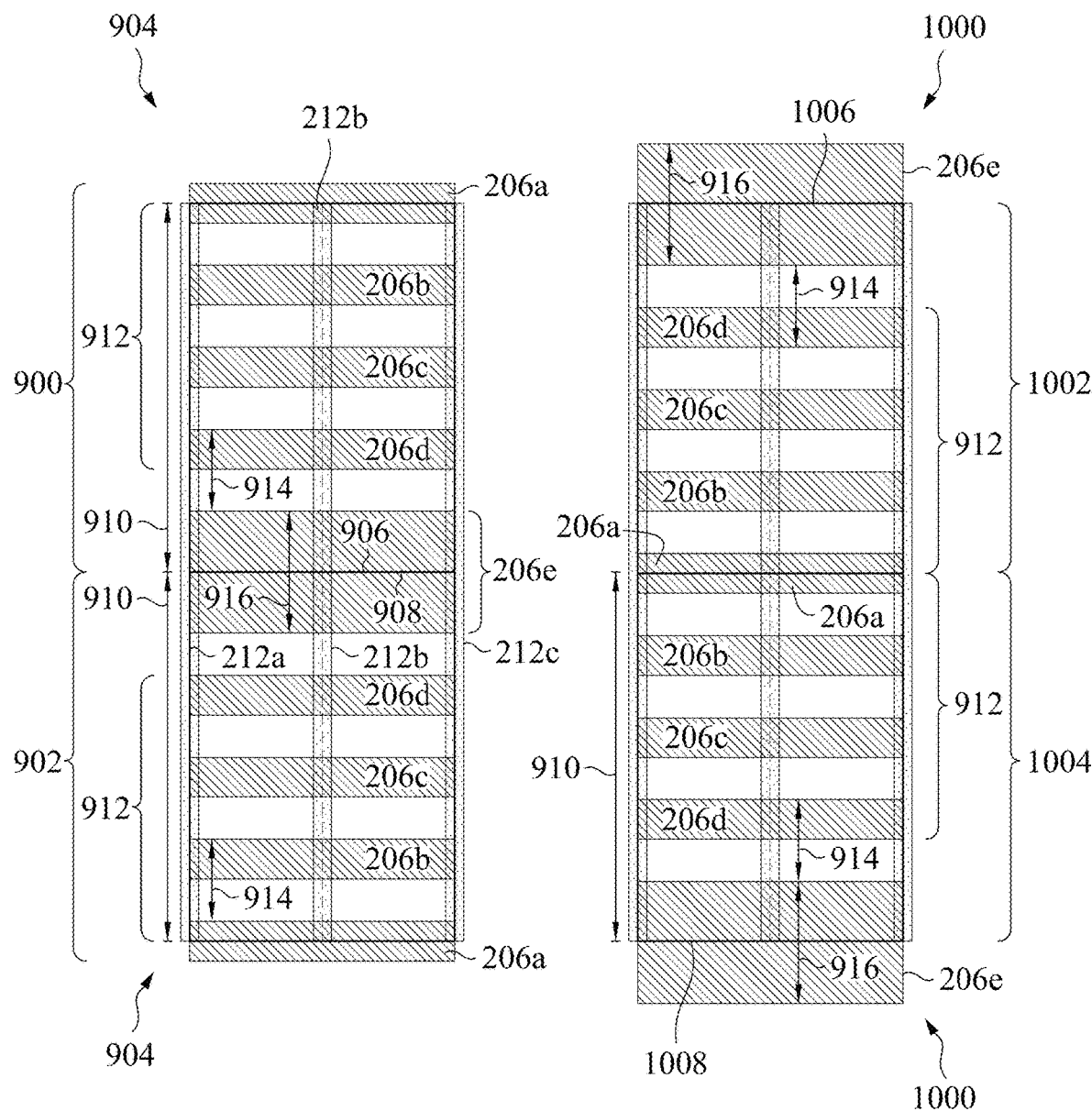
FIG. 9  FIG. 10
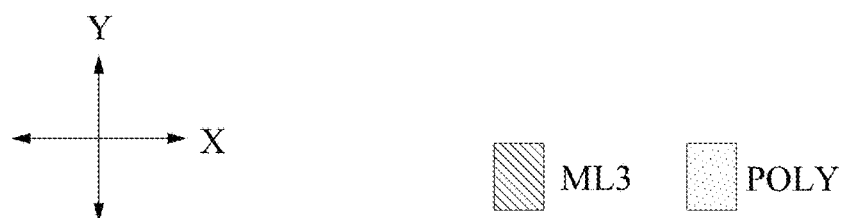

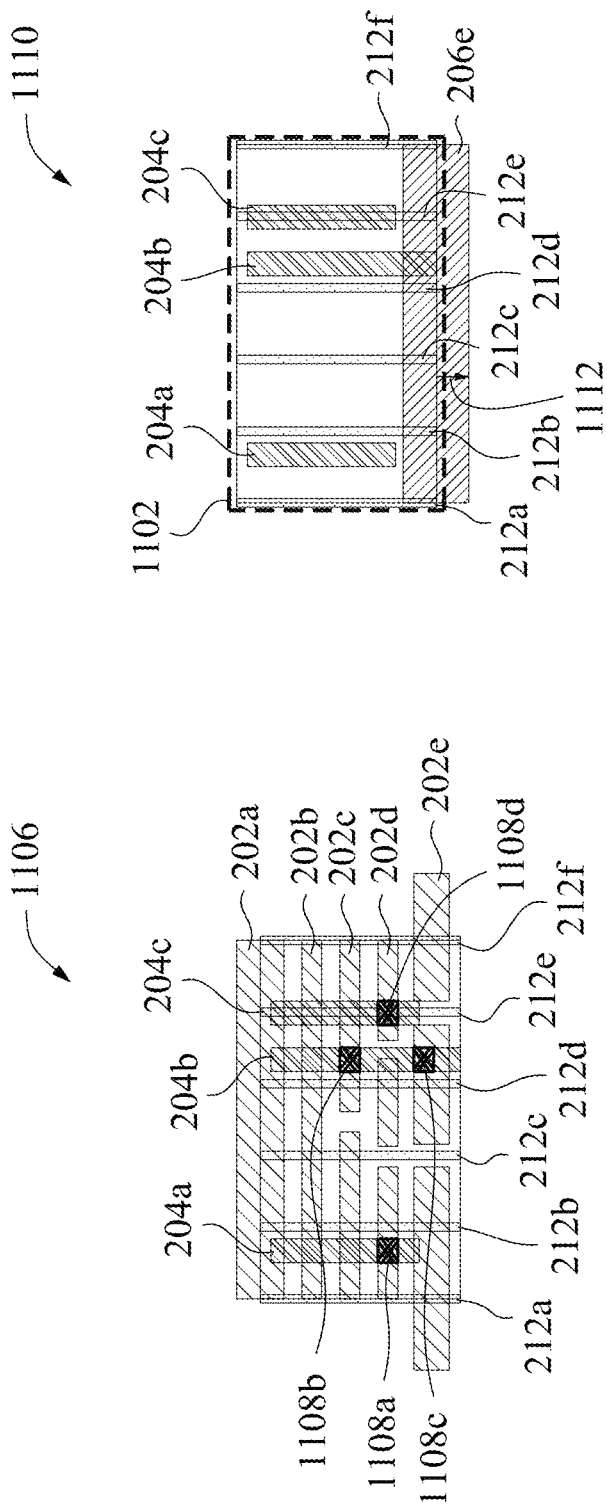
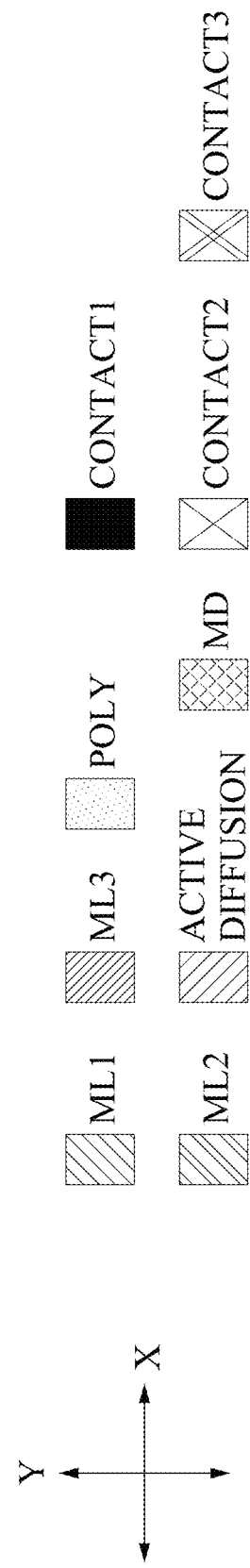
FIG. 11B
FIG. 11C

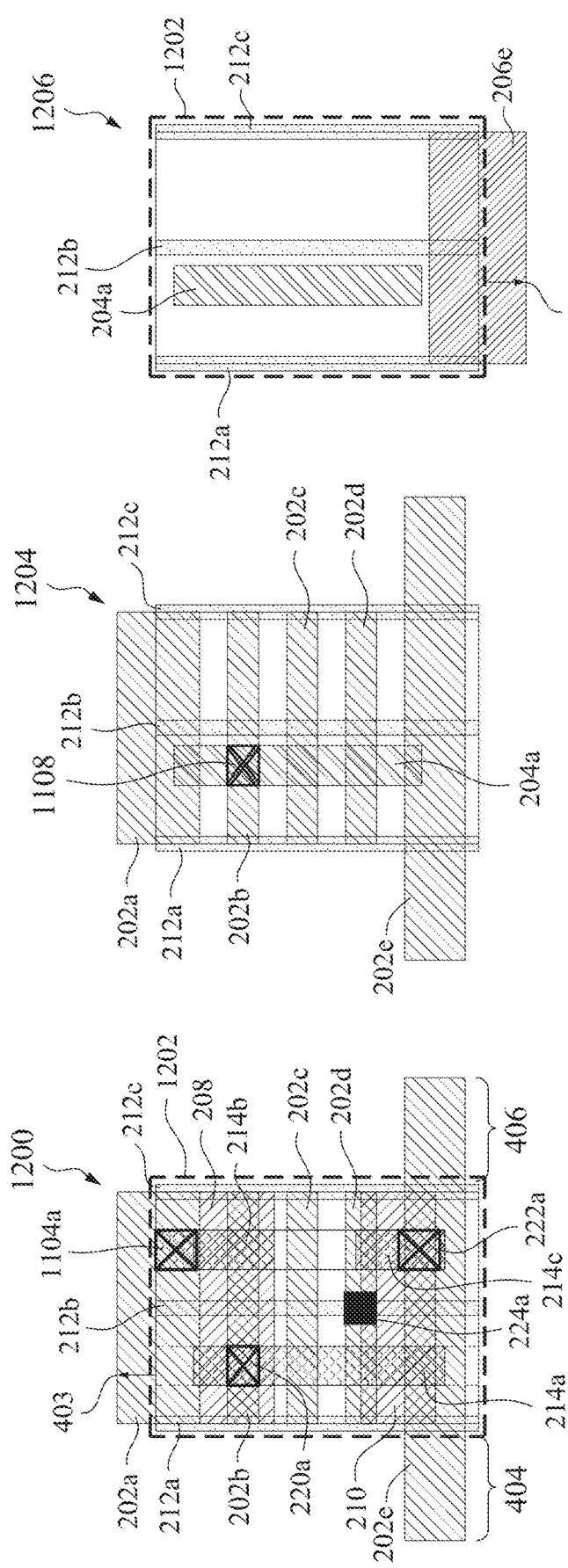
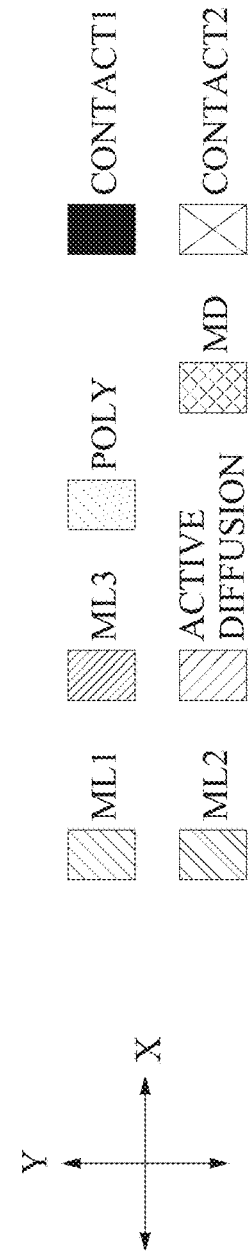
FIG. 12A  FIG. 12B  FIG. 12C

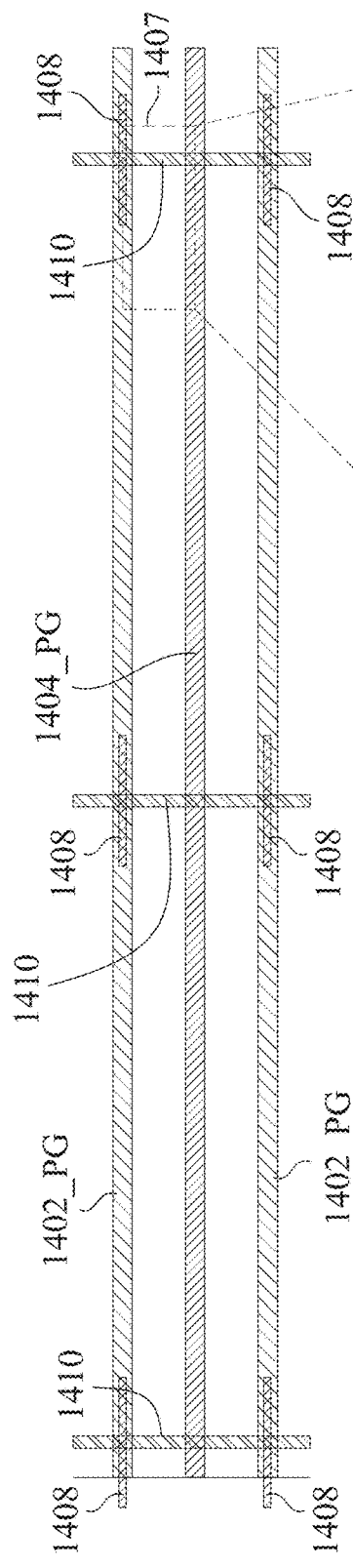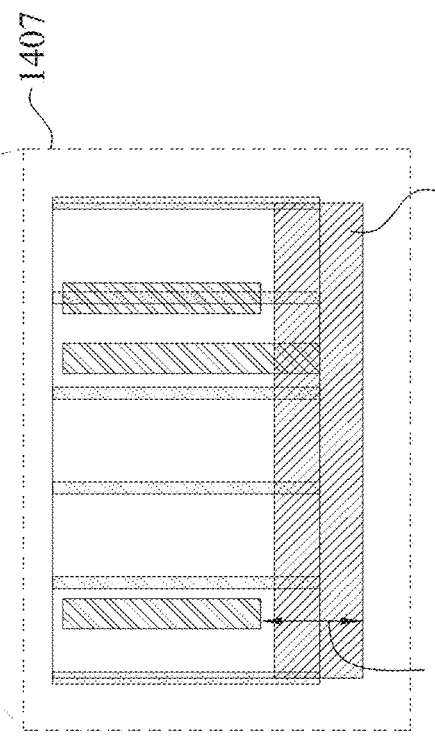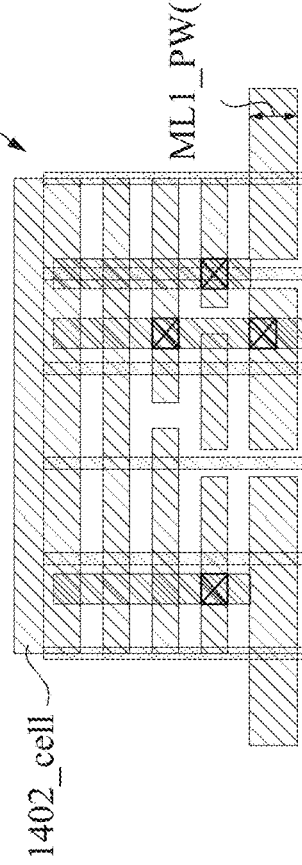
FIG. 14A
FIG. 14B
FIG. 14C

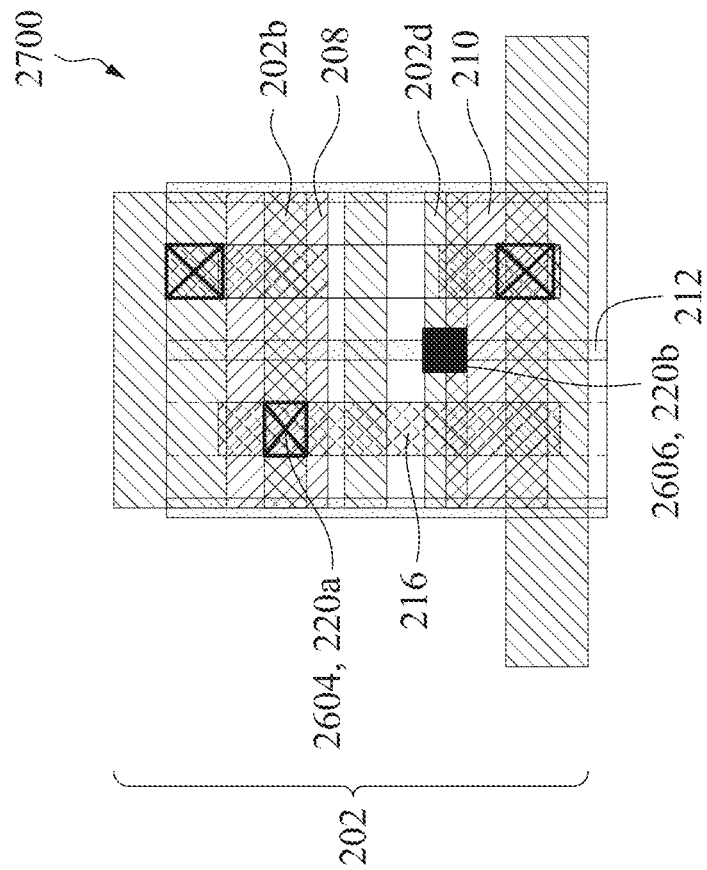
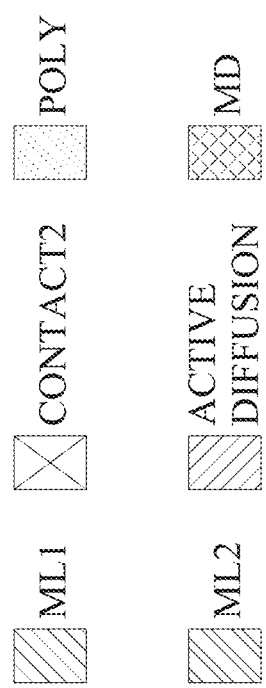
FIG. 27

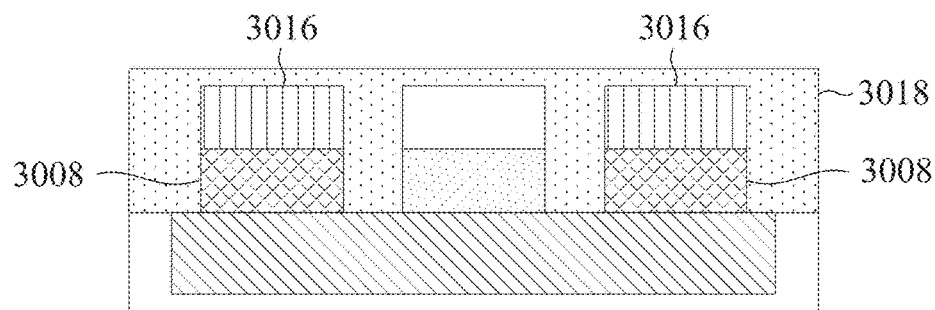
FIG. 30E
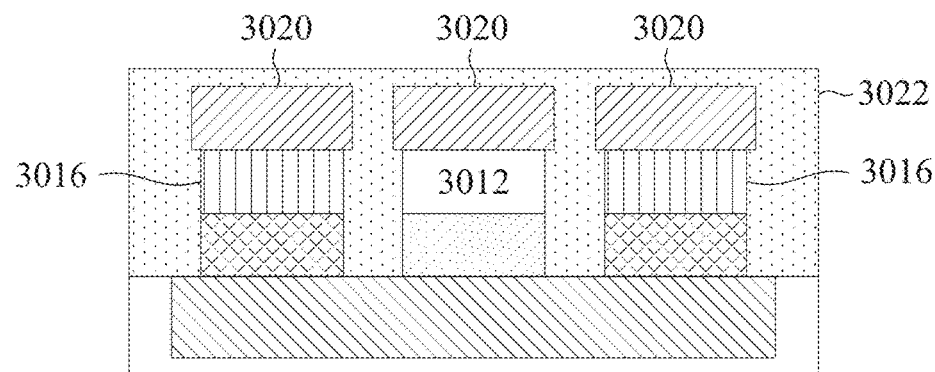
FIG. 30F
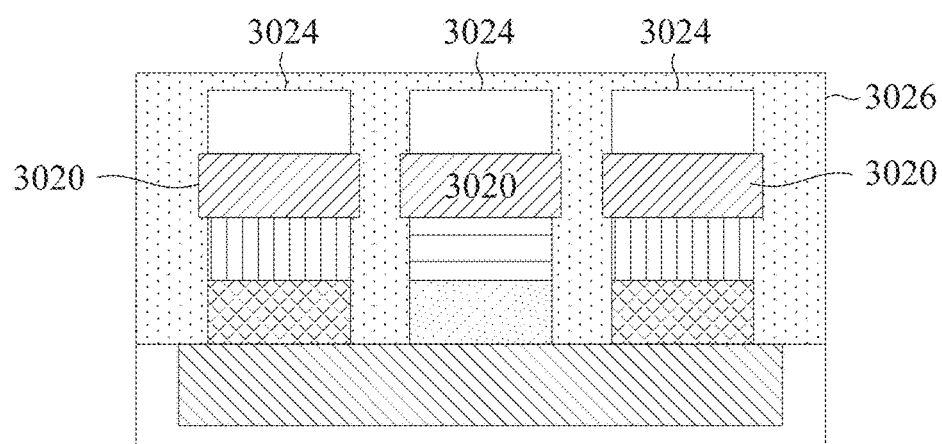
FIG. 30G
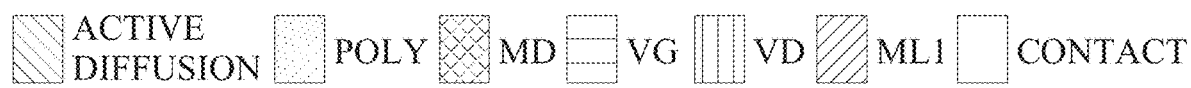

CELL STRUCTURES AND POWER ROUTING FOR INTEGRATED CIRCUITS

CROSS-REFERENCE TO RELATED APPLICATION(S)

This application is a division of U.S. patent application Ser. No. 17/127,091, entitled "Cell Structures and Power Routing for Integrated Circuits," filed on Dec. 18, 2020, which claims the benefit of U.S. Provisional Application No. 62/982,321, entitled "Memory Cell Structures For A Memory Device," filed on Feb. 27, 2020, of which the entire disclosures are hereby incorporated by reference.

BACKGROUND

Over the last four decades the semiconductor fabrication industry has been driven by a continual demand for greater performance (e.g., increased processing speed, memory capacity, etc.), a shrinking form factor, extended battery life, and lower cost. In response to this demand, the industry has continually reduced a size of semiconductor device components, such that modern day integrated circuit (IC) chips may comprise millions or billions of semiconductor devices arranged on a single semiconductor die.

BRIEF DESCRIPTION OF THE DRAWINGS

Aspects of the present disclosure are best understood by the following detailed description in conjunction with the accompanying drawings, where like reference numerals designate like structural elements. It is noted that various features in the drawings are not drawn to scale. In fact, the dimensions of the various features may be arbitrarily increased or reduced for clarity of discussion.

FIG. 6 illustrates an example first cell structure definition for the second metal layer in accordance with some embodiments;

FIG. 7 depicts an example second cell structure definition for the second metal layer in accordance with some embodiments;

FIG. 8 illustrates an example third cell structure definition for the second metal layer in accordance with some embodiments;

FIG. 9 depicts an example first cell structure definition for the third metal layer in accordance with some embodiments;

FIG. 10 illustrates an example second cell structure definition for the third metal layer in accordance with some embodiments;

FIG. 11B illustrates an example layout for a second metal layer for the first cell in accordance with some embodiments;

FIG. 11C depicts an example layout for a third metal layer for the first cell in accordance with some embodiments;

FIG. 12A illustrates an example layout for a first metal layer for a second cell in accordance with some embodiments;

FIG. 12B depicts an example layout for a second metal layer for the second cell in accordance with some embodiments;

FIG. 12C illustrates an example layout for a third metal layer for the second cell in accordance with some embodiments;

FIG. 14A illustrates an example layout for a power distribution network for an integrated circuit in accordance with some embodiments;

FIG. 14B depicts an example layout for a first metal layer for a fourth cell in accordance with some embodiments;

FIG. 14C illustrates an expanded view of a portion of the example layout shown in FIG. 14A in accordance with some embodiments;

FIG. 27 depicts a first layout of the cell shown in FIG. 26 that is produced by a first design process in accordance with some embodiments;

FIG. 30E illustrates block 2916 shown in FIG. 29B in accordance with some embodiments;

FIG. 30F depicts block 2920 shown in FIG. 29B in accordance with some embodiments;

FIG. 30G illustrates block 2924 shown in FIG. 29B in accordance with some embodiments;

DETAILED DESCRIPTION

Figure 1:
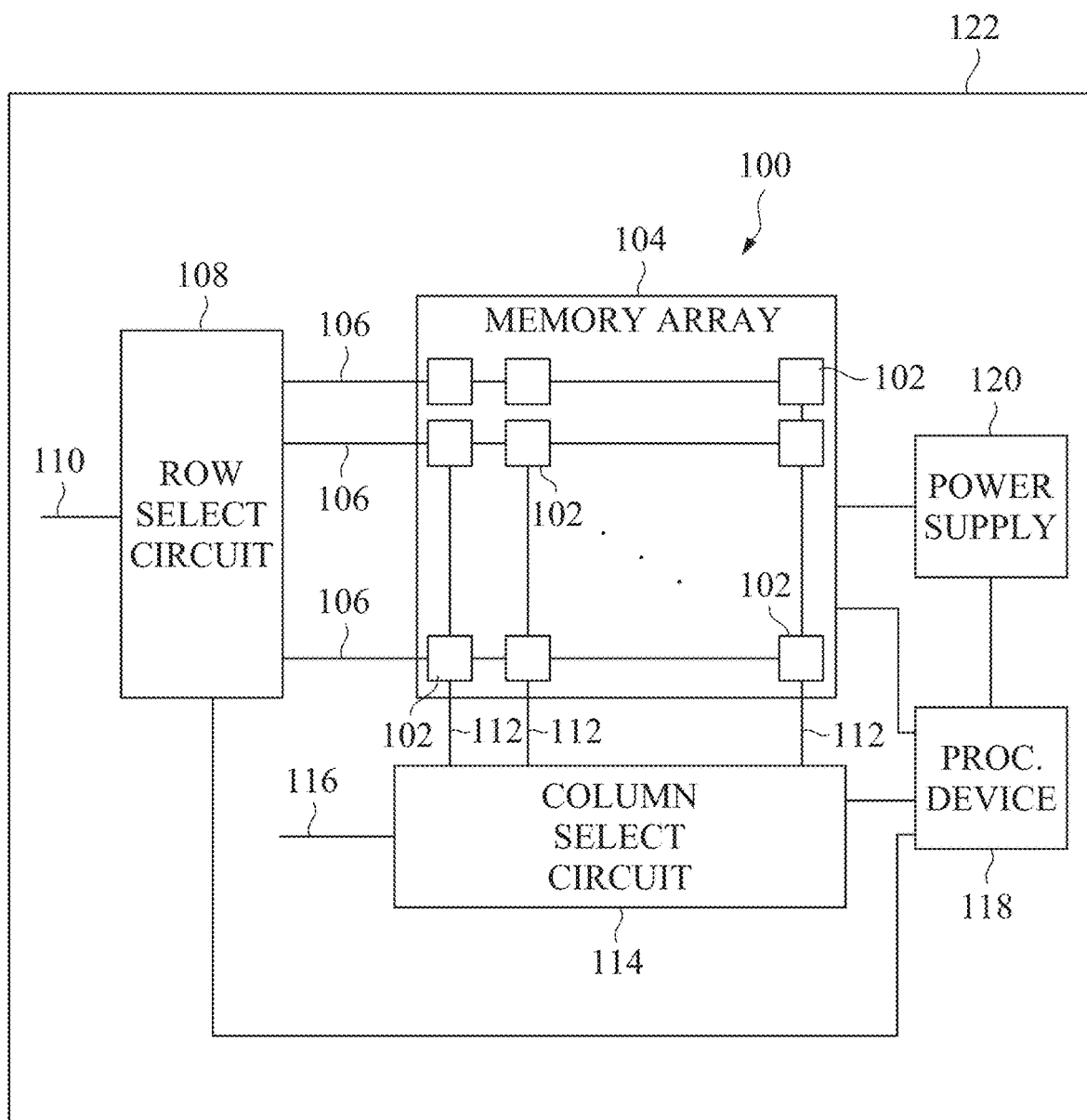
FIG. 1 depicts a block diagram of an example integrated circuit in which aspects of the disclosure may be practiced in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "under", "upper," "top," "bottom," "front," "back," and the like, may be used herein for ease of description to describe one element or feature's relationship to another element(s) or feature(s) as illustrated in the Figure(s). The spatially relative terms are intended to encompass different orientations of the device in use or operation in addition to the orientation depicted in the figures. Because components in various embodiments can be positioned in a number of different orientations, the directional terminology is used for purposes of illustration only and is in no way limiting. When used in conjunction with layers of an integrated circuit, semiconductor device, or electronic device, the directional terminology is intended to be construed broadly, and therefore should not be interpreted to preclude the presence of one or more intervening layers or other intervening features or elements. Thus, a given layer that is described herein as being formed on, over, or under, or disposed on, over, or under another layer may be separated from the latter layer by one or more additional layers.

Integrated circuits are commonly used in various electronic devices. Integrated circuits include cells that include electronic circuits ("components") that provide the functionality or functionalities of the integrated circuit. Example components include, but are not limited to, logic components such as flip flop, latch, NAND, OR, AND, inverter, and NOR circuits, as well as resistors, capacitors, inductors, diodes, transistors, amplifiers, buffers, memory, processors, comparators, and the like. The cells are typically arranged in a grid pattern (rows and columns) with one or more metal layers to provide contacts, signal lines, and power lines to the cells.

Embodiments disclosed herein provide various memory cell structures and power routings for one or more cells in an integrated circuit. In some instances, the embodiments reduce the IR drop (e.g., the voltage drop) across one or more metal stripes. Reducing the IR drop can improve the operation and performance of the integrated circuit. In one embodiment, a power stripe in a first metal layer can be used to provide a first voltage source (e.g., VDD) while a power stripe in a different metal layer may be used to provide a different second voltage (e.g., VSS or ground). Using different metal layers for the metal stripes that provide the different voltage sources allows one or both power stripes to have a larger width, which in turn increases the total area of the metal stripe(s). The increased area reduces the IR drop across the metal stripe.

In some embodiments, the first metal layer is asymmetric with respect to the second metal layer. For example, the first metal layer can have N metal stripes that are used for signals while the second metal layer has M metal stripes that are used for signals, where N does not equal M. For example, N can be less the M. Using fewer metal stripes for signals in the first metal layer allows the area of the metal stripe for the first voltage source to have a larger area.

The embodiments described herein are described with respect to metal layers, metal stripes, poly layers, and poly lines. However, other embodiments are not limited to metal layers, metal stripes, poly layers, and poly lines. Any suitable conductor that is made of one or more conductive materials can be used. Additionally, the conductors can be formed in one or more conductor layers.

These and other embodiments are discussed below with reference to FIGS. 1-32. However, those skilled in the art will readily appreciate that the detailed description given herein with respect to these Figures is for explanatory purposes only and should not be construed as limiting.

FIG. 1 depicts a block diagram of an example integrated circuit in which aspects of the disclosure may be practiced in accordance with some embodiments. The illustrated integrated circuit is a memory device 100, although other embodiments are not limited to this type of an integrated circuit. The memory device 100 includes memory cells 102 that are arranged in rows and columns to form a memory array 104. The memory device 100 can include any suitable number of rows and columns. For example, a memory device includes R number of rows and C number of columns, where R is an integer greater than or equal or one and C is a number greater than or equal to one. Other embodiments are not limited to rows and columns of memory cells 102. The memory cells 102 in a memory array 104 can be organized in any suitable arrangement.

Each row of memory cells 102 is operably connected to one or more word lines (collectively word line 106). The word lines 106 are operably connected to one or more row select circuits (collectively referred to as row select circuit 108). The row select circuit 108 selects a particular word line 106 based on an address signal that is received on signal line 110.

Each column of memory cells 102 is operably connected to one or more bit lines (collectively bit line 112). The bit lines 112 are operably connected to a one or more column select circuits (collectively referred to as column select circuit 114). The column select circuit 114 selects a particular bit line 112 based on a select signal that is received on signal line 116.

A processing device 118 is operably connected to the memory array 104, the row select circuit 108, and the column select circuit 114. The processing device 118 is operable to control one or more operations of the memory array 104, the row select circuit 108, and the column select circuit 114. Any suitable processing device can be used. Example processing devices include, but are not limited to, a central processing unit, a microprocessor, an application specific integrated circuit, a graphics processing unit, a field programmable gate array, or combinations thereof.

A power supply 120 is operably connected to the memory array 104 and the processing device 118. In some embodiments, the power supply 120 is also operably connected to the row select circuit 108 and the column select circuit 114. The processing device 118 and/or the power supply 120 can be disposed in the same circuitry (e.g., macro) as the memory array. In an example embodiment, the macro refers to a memory unit that includes the memory array and peripherals such as the control block, input/output block, row decoder circuitry, column decoder circuitry, etc. In other embodiments, the processing device 118 and/or the power supply 120 may be disposed in separate circuitry and operably connected to the macro (e.g., the memory array).

When data is to be written to a memory cell 102 (e.g., the memory cell 102 is programmed), or is to be read from a memory cell 102, an address for the memory cell is received on signal line 110. The row select circuit 108 activates or asserts the word line 106 associated with the address. A select signal is received on the signal line 116 and the bit line 112 associated with the select signal is asserted or activated. The data is then written to, or read from, the memory cell 102.

The memory device 100, the row select circuit 108, the column select circuit 114, the processing device 118, and the power supply 120 are included in an electronic device 122. The electronic device 122 can be any suitable electronic device. Example electronic devices include, but are not limited to, a computing device such as a laptop computer and a tablet, a cellular telephone, a television, an automobile, a stereo system, and a camera.

Figure 2:
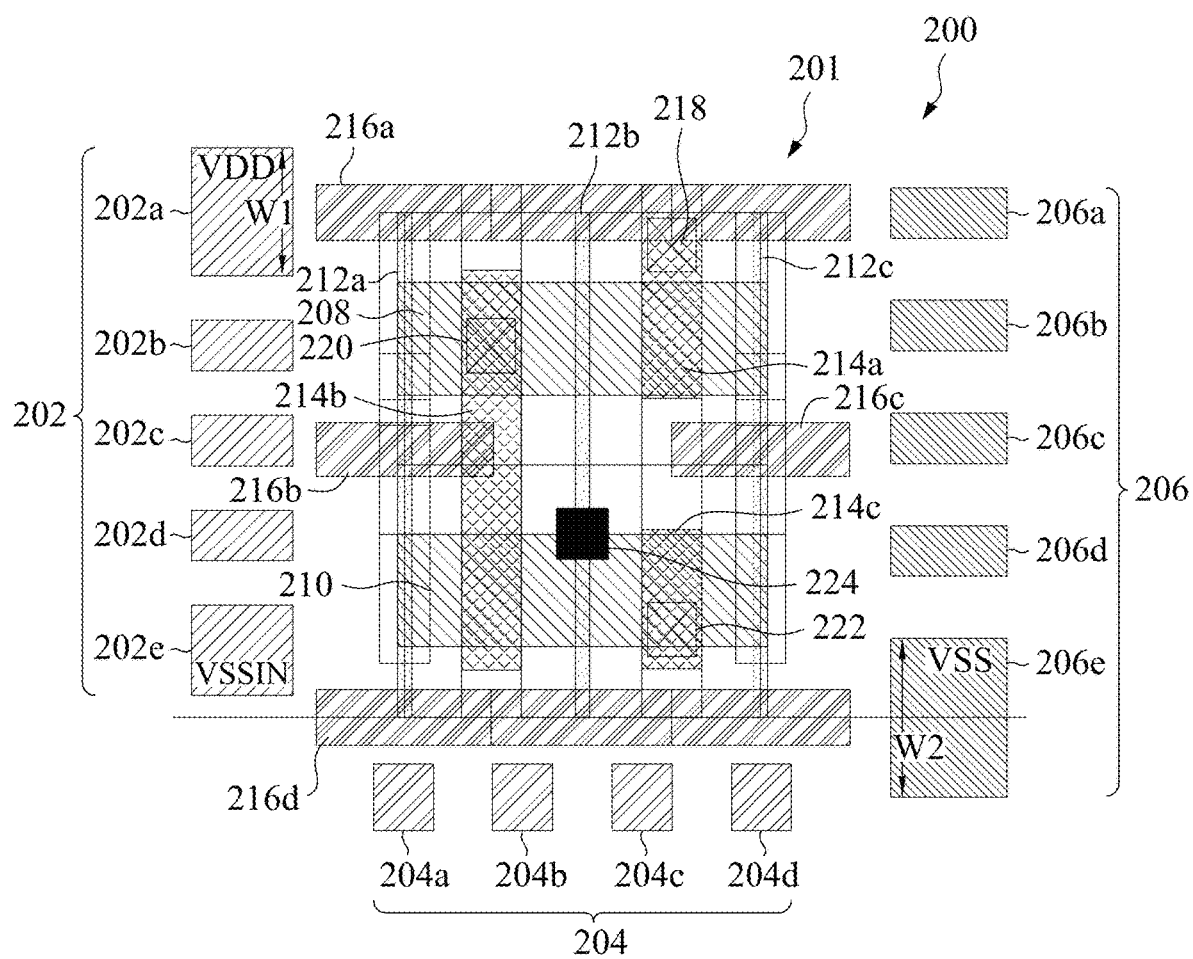
FIG. 2 illustrates a layout of a cell structure in accordance with some embodiments.

FIG. 2 illustrates a layout of a cell structure in accordance with some embodiments. The example cell structure 200 is suitable for use in the memory device shown in FIG. 1. The cell structure 200 for the cell 201 includes a first metal (ML1) layer 202, a second metal (ML2) layer 204, and a third metal (ML3) layer 206. In a non-limiting example, the ML1 layer 202 is a M0 layer, the ML2 layer 204 is a M1 layer, and the ML3 layer 206 is an M2 layer. Example connections between the layers of the cell 201 are described in more detail in conjunction with FIGS. 26-28.

In the illustrated embodiment, the metal stripe 202a in the ML1 layer 202 is configured to operably connect to a first voltage source to supply a first voltage signal (e.g., VDD) and the metal stripe 206e in the ML3 layer 206 is configured to operably connect to a second voltage source to supply a second voltage signal (e.g., VSS or ground). Accordingly, the metal stripe 202a and the metal stripe 206e are referred to herein as power stripes. The metal stripes 202b, 202c, 202d in the ML1 layer 202, the metal stripes 204a, 204b, 204c, 204d in the ML2 layer 204, and the metal stripes 206a, 206b, 206c, 206d in the ML3 layer 206 are used for various signals. In an example embodiment, the metal stripe 202e in the ML1 layer 202 is used for signals. In another example embodiment, the metal stripe 202e is used as an internal signal line for the second voltage source that provides the second voltage signal internally to the cell 201. The metal stripe 202e can be a segment or a shorter metal stripe that acts as a via to provide the second voltage signal to in the ML3 layer 206 to the ML1 layer 202.

The cell 201 includes a first active diffusion region 208 and a second active diffusion region 210 that are disposed in the x direction. The first and the second active diffusion regions 208, 210 can include fin structures that are disposed on a substrate (not shown) and serve as active regions of the transistors (e.g., field effect transistors) in the cell 201. Specifically, the fin structures may serve as channel regions of the transistors when positioned below the polysilicon ("poly") lines 212a, 212b, 212c and/or serve as source regions or drain regions when positioned below metal stripes. In a non-limiting example, the first active diffusion region 208 a source/drain region for a p-type transistor and the second active diffusion region 210 is a source/drain region for an n-type transistor. The poly lines 212a, 212b, 212c are disposed in the y direction and serve as the gate electrodes of the transistors in the cell 201.

Metal-to-diffusion (MD) regions 214a, 214b, 214c are disposed in the y direction over the first and/or the second active diffusion regions 208, 210 and between the poly lines 212a, 212b, 212c. In particular, the MD region 214a is positioned over the first active diffusion region 208, the MD region 214b is disposed over the first and the second active diffusion regions 208, 210, and the MD region 214c is positioned over the second active diffusion region 210. Elements 216a, 216b, 216c, 216d are disposed in the x direction and are included in a cut poly layer. Elements 216a, 216b, 216c, 216d cut off or remove the poly lines 212a, 212b, 212c at the locations where the elements 216a, 216b, 216c, 216d overlap the poly lines 212a, 212b, 212c. Contact 218 (CONTACT2) provides a contact between the power stripe 202a and the MD region 214a.

The contact 220 (CONTACT2) provides a contact between the MD region 214b and the metal stripe 202b. The contact 222 (CONTACT2) provides a contact between the MD region 214c and the metal stripe 202e. The contact 224 (CONTACT1) provides a contact between the metal stripe 202d and the poly line 212b. In one embodiment, the location of the CONTACT1 contact is determined by an engineer or a designer and is in a layout initial version, and the locations of the CONTACT2 contacts 218, 220, 222 are determined by an electrical design automation tool and are added to the layout initial version to produce the (final) layout of the cell structure 200.

In the illustrated embodiment, the first voltage signal supplied by the first voltage source is provided by the power stripe 202a in the ML1 layer and the second voltage signal supplied by the second voltage source is provided by the power stripe 206e in the ML3 layer. Additionally, the layout of the ML1 layer 202 is asymmetric with respect to the layout of the ML3 layer 206. For example, the ML1 layer 202 has N metal stripes (e.g., three metal stripes 202b, 202c, 202d) that can be used for signals while the ML3 layer 206 has M metal stripes (e.g., four metal stripes 206a, 206b, 206c, 206d) that may be used for signals, where N is less than M. Including one power stripe 202a in the ML1 layer, and using N metal stripes for signals in the ML1 layer 202, allows the width W1 of the power stripe 202a to be larger, which increases the total area of the power stripe 202a. The increased total area reduces the IR drop across the power stripe 202a. In a non-limiting example, the width W1 of the power stripe 202a can be thirty (30) nanometers (nm).

Additionally or alternatively, the width W2 of the power stripe 206e can be larger because the power stripe 206e is in the ML3 layer, a different metal layer than the ML1 layer. The larger width W2 of the power stripe 206e increases the total area of the power stripe 206e, and the increased total area of the power stripe 206e reduces the IR drop across the power stripe 206e. In a non-limiting example, the width of the power stripe may be twenty-four (24) nm.

Figure 3:
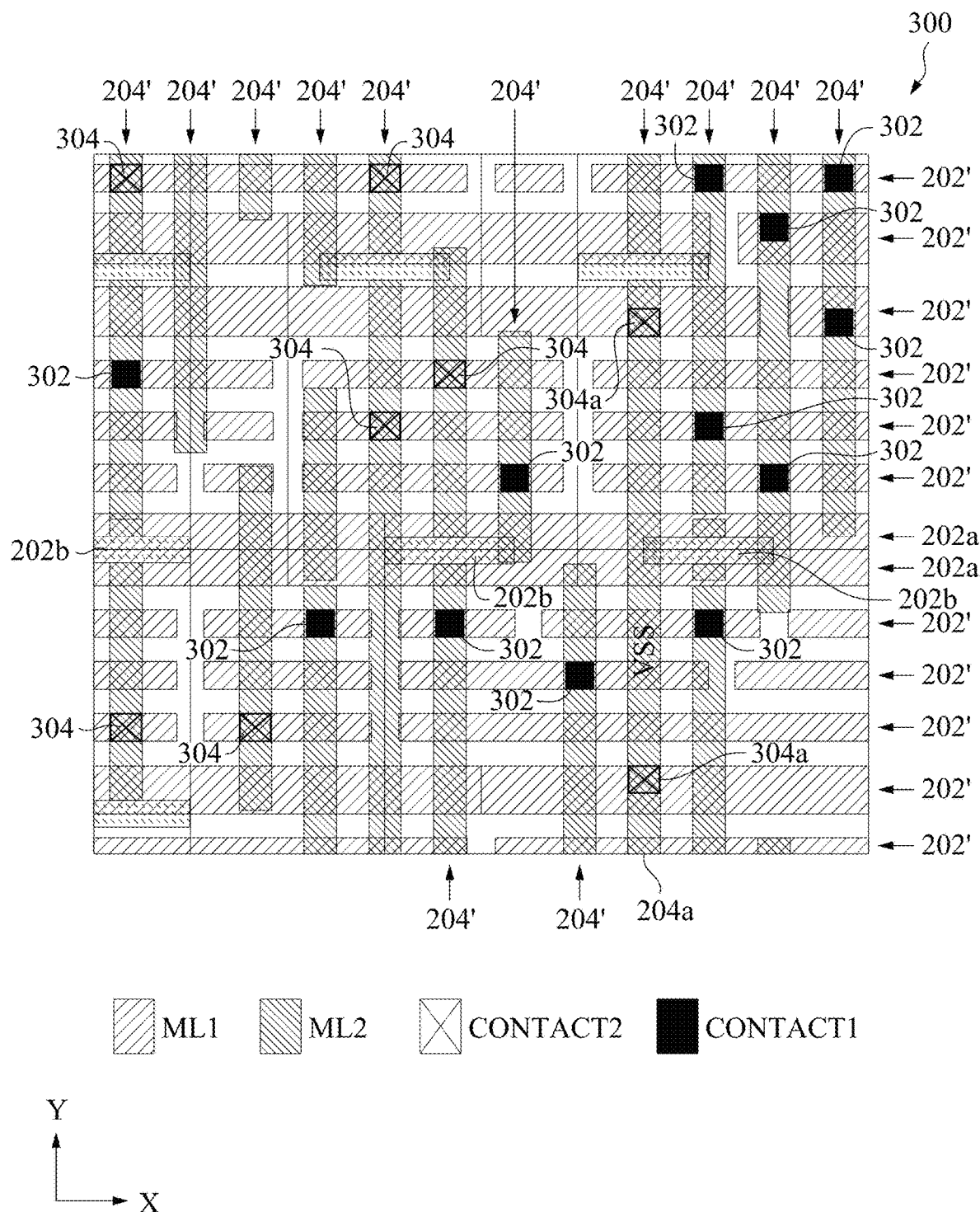
FIG. 3 depicts a portion of an example layout of an integrated circuit in accordance with some embodiments.

FIG. 3 depicts a portion of an example layout of an integrated circuit in accordance with some embodiments. The integrated circuit includes components such as one or more NAND circuits, one or more AND circuits, one or more OR circuits, one or more NOR circuits and/or one or more inverters. In the illustrated embodiment, the layout 300 includes the metal stripes 202' in the ML1 layer 202 disposed in the x direction and the metal stripes 204' in the ML2 layer 204 disposed over the ML1 layer 202 in the y direction. The power stripe 202a in the ML1 layer 202 is used to route the first voltage signal supplied by the first voltage source (e.g., VDD) in the integrated circuit. The metal stripes 202b in the ML1 layer 202 are included in a cut metal layer and are used to cut off or remove respective metal stripes 204' in the ML2 layer 204 at the locations where the metal stripes 202b overlap the respective metal stripes 204'. The metal stripe 204a in the ML2 layer 204 is used to route the second voltage signal supplied by the second voltage source (e.g., VSS or ground) within the ML2 layer 204 and to connect the second voltage source to the ML3 metal layer.

Each contact 302 (CONTACT1) provides a contact between the ML1 layer 202 and the ML2 layer 204. Each contact 304 (CONTACT2) provides a contact between the ML1 layer 202 and the ML2 layer 204. The contacts 304a (CONTACT2) provide a contact between the ML1 layer 202 and the metal stripe 204a that provides the second voltage signal. In one embodiment, the locations of the CONTACT1 contacts are in a layout initial version of the integrated circuit and the locations of the CONTACT2 contacts are determined by an electrical design automation tool and added to the layout initial version to produce the layout 300.

Figure 4:
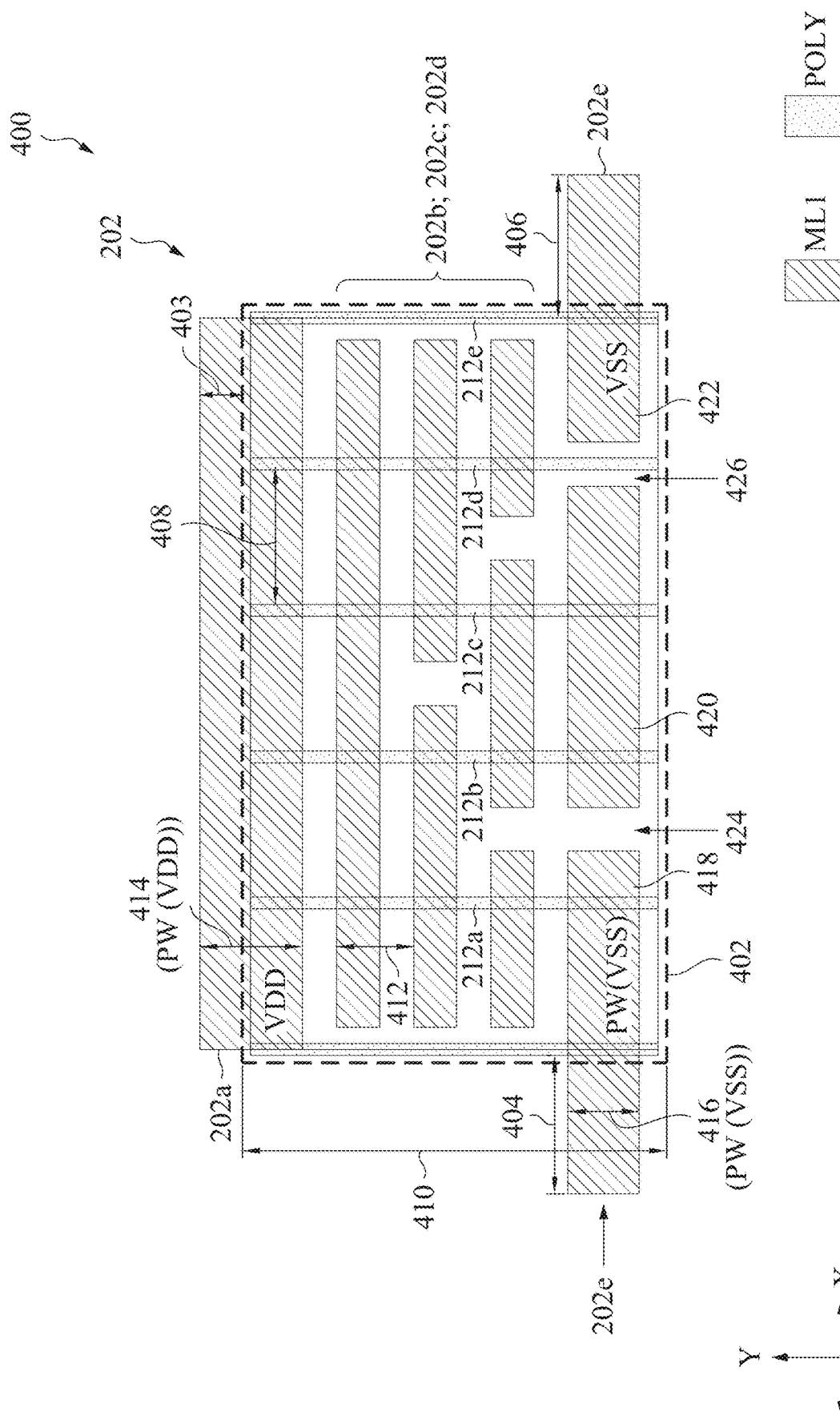
FIG. 4 illustrates an example first cell structure definition for the first metal layer in accordance with some embodiments.

FIG. 4 illustrates an example first cell structure definition for the first metal layer in accordance with some embodiments. As described previously, in one embodiment, the ML1 layer 202 is the M0 layer and is disposed in the x direction. The first cell structure 400 also includes poly lines 212a, 212b, 212c, 212d, 212e disposed over the ML1 layer 202 in the y direction.

The illustrated first cell structure 400 for the ML1 layer 202 includes the power stripe 202a that is configured to connected to the first voltage source (e.g., VDD) to supply the first voltage signal, the metal stripes 202b, 202c, 202d for signals, and the metal stripe 202e that is used for a signal and/or as an internal signal line for the second voltage signal (e.g., VSS or ground). The power stripe 202a extends outside of the cell boundary 402 in the y direction by an extension 403. The extension 403 can be shared by an adjacent cell (e.g., another cell above in the y direction and abutting the cell). Thus, the power stripe 202a can be shared by two adjacent cells.

As shown, the metal stripe 202e extends outside of the cell boundary 402 in the x direction by a first extension 404 and by a second extension 406 for power routing. As will be described in more detail in conjunction with FIGS. 18 and 19, the first and the second extensions 404, 406 are implemented in a space that is shared by two adjacent cells ("shared space"). The first and the second extensions 404, 406 in the metal stripe 202e allow for an increased number of connections between the metal stripe 202e and an upper metal layer (e.g., the ML3 layer 206). In a non-limiting example, the metal stripe 206e in the ML3 layer that is operable to provide the second voltage signal can be connected to the first and the second extensions 404, 406 to provide the second voltage signal internally to the cell. The length of the first extension 404 can be equal to, or different from, the length of the second extension 406. In one embodiment, the lengths of the first and the second extensions 404, 406 are in the range of approximately 0.5 to 1 of the contacted poly pitch (CPP) (e.g., the transistor gate pitch). In FIG. 4, the distance 408 represents the poly pitch, and can be the CPP.

In one embodiment, the cell height (CH) 410 can be defined by the equation CH=(signal track number+0.5)× ML1 pitch+(0.5×ML1_PW(VDD))+ML1_PW(VSS), where the ML1 pitch is 412 (the pitch of the signal tracks in the ML1 layer 202), ML1_PW(VDD) is the width 414 of the power stripe 202a, and ML_PW(VSS) is the width 416 of the metal stripe 202e. In a non-limiting example, the CH 410 is in the range of approximately one hundred (100) to one hundred and thirty (130) nm. The width 414 (ML1_PW (VDD)) of the power stripe 202a is in the range of approximately (0.25×CH) to (0.3×CH). As discussed earlier, the area of the power stripe 202a can reduce the VDD IR drop. To reduce the IR drop further, the width 416 (ML1_PW (VSS)) of the metal stripe 202e can be in the range of approximately (0.15×CH) to (0.2×CH).

In some embodiments, the metal stripe 202e is split into multiple metal segments 418, 420, 422. The metal segments 418, 422 are configured to connect to the second voltage source to provide the second voltage signal (e.g., VSS or ground) and the metal segment 420 is used for a signal. The distance to the split location 424 between the metal segments 418, 420 and the cell boundary 402, and the distance to the split location 426 between the metal segments 420, 422 and the cell boundary 402 is one (1) CPP, although other embodiments are not limited to this distance.

Figure 5:
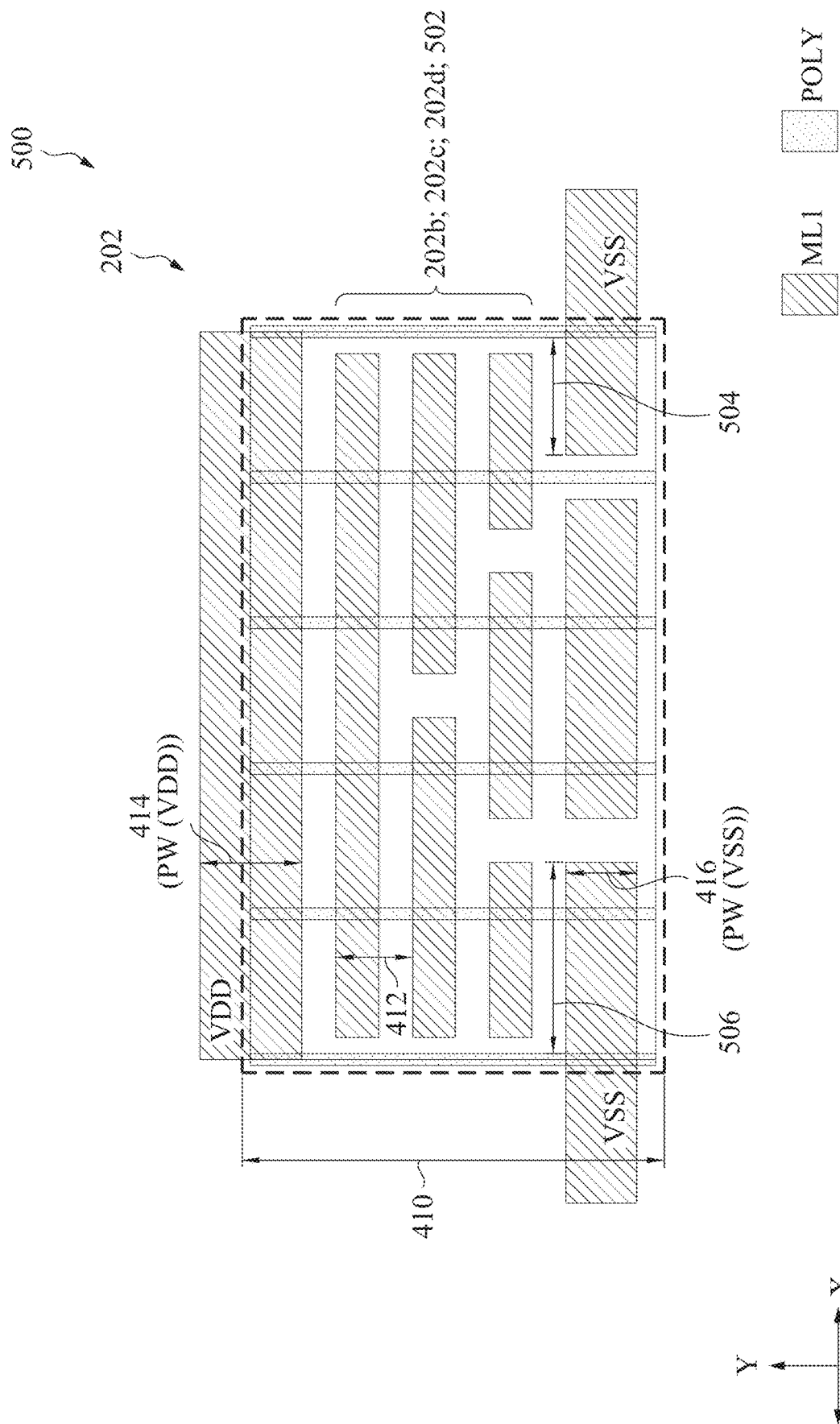
FIG. 5 depicts an example second cell structure definition for the first metal layer in accordance with some embodiments.

FIG. 5 depicts an example second cell structure definition for the first metal layer in accordance with some embodiments. The second cell structure definition 500 shown in FIG. 5 is similar to the first cell structure 400 shown in FIG. 4, except for the 3.5 metal stripes 202b, 202c, 202d, 502 in the ML1 layer 202. In one embodiment, one of the metal stripes is a shared signal line that is used for both power and a signal.

In a non-limiting example, the second cell structure definition 500 can be used with a four input circuit, such as, for example, a four input NAND or a four input OR circuit. FIG. 5 also illustrates an example of one CPP 504 and an example of one and a half (1.5) CPP 506. In one embodiment, the cell height 410, the ML1 pitch 412, the width 414 (ML1_PW(VDD)), and the width 416 (ML1_PW(VSS)) are configured as described in conjunction with FIG. 4.

FIG. 6 illustrates an example first cell structure definition for the second metal layer in accordance with some embodiments. As described earlier, in one embodiment, the ML2 layer 204 is the M1 layer in an integrated circuit. Additionally or alternatively, the ML2 layer 204 is used to route the second voltage signal (e.g., VSS or ground).

In the illustrated embodiment, the first cell structure 600 includes a first metal stripe 204a, a second metal stripe 204b, poly lines 212a, 212b, 212c disposed in the y direction, and MD regions 214a, 214b also disposed in the y direction between the poly lines 212a, 212b, 212c. The pattern of the ML2 layer 204 is defined by a ratio of CPP:M1 pitch, which is 1:1 in the illustrated embodiment. FIG. 6 also shows the poly pitch 602 and the ML2 layer pitch 604. Additionally, the metal stripes 204a, 204b can be aligned to the MD layer that includes the MD regions 214a, 214b.

FIG. 7 depicts an example second cell structure definition for the second metal layer in accordance with some embodiments. The example second cell structure 700 includes the first metal stripe 204a, the second metal stripe 204b, a third metal stripe 204c, the poly lines 212a, 212b, 212c disposed in the y direction, and the MD regions 214a, 214b disposed in the y direction between the poly lines 212a, 212b, 212c. The pattern of the ML2 layer 204 is defined by the CPP:M1 pitch ratio, which is 3:2 in the illustrated embodiment. FIG. 7 also shows the poly pitch 702 and the ML2 layer pitch 704. Additionally, the metal stripes 204a, 204b can be aligned to the MD layer that includes the MD regions 214a, 214b.

FIG. 8 illustrates an example third cell structure definition for the second metal layer in accordance with some embodiments. The representative third cell structure 800 includes the first metal stripe 204a, the second metal stripe 204b, the third metal stripe 204c, a fourth metal stripe 204d, the poly lines 212a, 212b, 212c disposed in the y direction, and the MD regions 214a, 214b disposed in the y direction between the poly lines 212a, 212b, 212c. The pattern of the ML2 layer 204 is defined by the CPP:M1 pitch ratio, which is 3:2 in the illustrated embodiment. FIG. 8 also shows the poly pitch 802 and the ML2 layer pitch 804. Additionally, the metal stripes 204a, 204b can be aligned to the poly layer that includes the poly lines 212a, 212b, 212c.

FIG. 9 depicts an example first cell structure definition for the third metal layer in accordance with some embodiments. Two adjacent cells 900, 902 are shown in FIG. 9, and the first cell structure definition 904 in cell 902 is a mirror image of the first cell structure definition 904 in cell 900. The example first cell structure definition 904 for the ML3 layer 206 includes the metal stripes 206a, 206b, 206c, 206d and the power stripe 206e disposed in the x direction. The poly lines 212a, 212b, and 212c are disposed in the y direction below the metal stripes 206a, 206b, 206c, 206d and the power stripe 206e. As discussed in conjunction with FIG. 2, the power stripe 206e is configured to connect to the second voltage source (e.g., VSS or ground) to provide the second voltage signal and the metal stripes 206a, 206b, 206c, and 206d are used for various signals. In FIG. 9, the power stripe 206e in the cell 900 is positioned at a cell edge 906 that abuts a cell edge 908 of the cell 902. In other words, the power stripe 206e is disposed at abutting cell edges 906, 908 of the two adjacent cells 900, 902.

In one embodiment, the cell height (CH) 910 is determined by the equation CH=signal track number×(ML3 pitch+0.5×ML3_PW(VSS)), where the signal track number is the number 912 of metal stripes used for signals, the ML3 pitch is the pitch 914 of the ML3 layer, and ML3_PW(VSS) is the width 916 of the power stripe 206e. In a non-limiting example, the width 916 of the power stripe 206e is in the range of approximately (0.25×CH) to (0.3×CH). As discussed earlier, the width 916 can reduce the VSS IR drop in some embodiments.

FIG. 10 illustrates an example second cell structure definition for the third metal layer in accordance with some embodiments. Two adjacent cells 1002, 1004 are shown in FIG. 10, and the second cell structure definition 1000 in cell 1004 is a mirror image of the second cell structure definition 1000 in cell 1002. The example second cell structure definition 1000 shown in FIG. 10 is similar to the first cell structure definition 904 shown in FIG. 9, except for the location of the power stripe 206e that provides the second voltage signal (e.g., VSS or ground).

Each cell 1002, 1004 includes the power stripe 206e at the non-abutting cell edge 1006, 1008 of the cell 1002, 1004, respectively. Although the cell edge 1006 does not abut the cell edge 1008 (hence "non-abutting cell edges"), the cell edges 1006, 1008 can each abut the cell edges of cells (not shown) that are adjacent in the y direction to the cells 1002, 1004, respectively. Each power stripe 206e can be shared with the adjacent cell (e.g., a cell above the cell 1002 and a cell below the cell 1004). In one embodiment, the cell height 910, the ML3 pitch 914, and the width 916 (ML3_PW (VSS)) are determined as described in conjunction with FIG. 9.

Figure 11A:
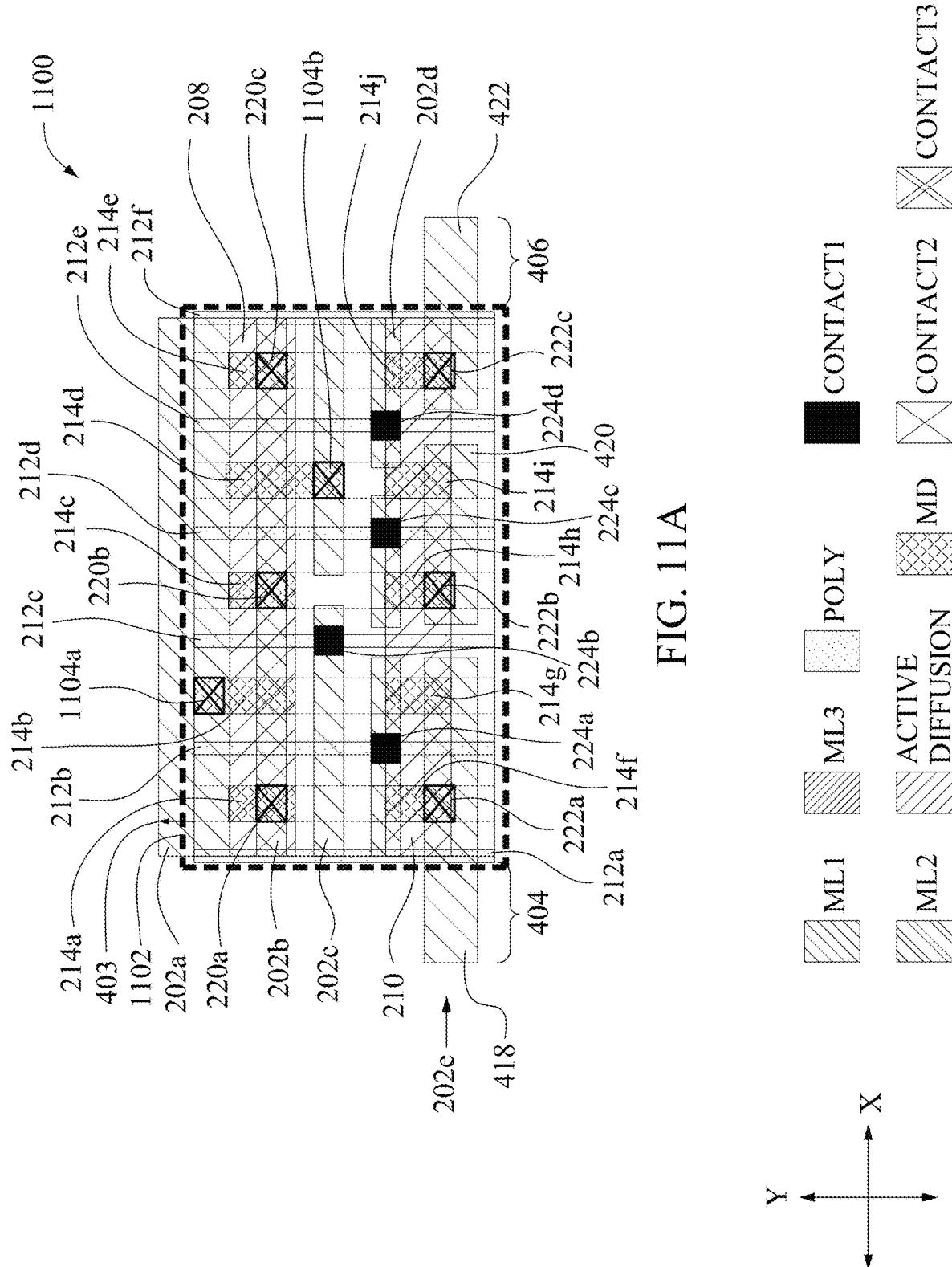
FIG. 11A depicts an example layout for a first metal layer for a first cell in accordance with some embodiments.

FIGS. 11A-11C depict an example cell structure for a first cell in accordance with some embodiments. In a non-limiting example, the first cell can be implemented as a four-input AND-OR-Invert circuit. FIG. 11A illustrates an example layout for the first metal layer in the first cell in accordance with some embodiments. The layout 1100 includes the power stripe 202a and the metal stripes 202b, 202c, 202d, 202e disposed in the x direction in the ML1 layer. The power stripe 202a is configured to connect to a first voltage source (e.g., VDD) to provide the first voltage signal and the metal stripes 202b, 202c, 202d are used for various signals. Like the embodiment shown in FIG. 4, the metal stripe 202e is used for both a signal and for an internal signal line for a second voltage signal (e.g., VSS or ground). The metal stripe 202e is divided into metal segments 418, 420, 422, where the metal segments 418, 422 provide the second voltage signal internally to the first cell and the metal segment 420 is used for a signal.

As shown, for power routing, the power stripe 202a extends outside of a first side of the cell boundary 1102 in the y direction by an extension 403, the metal segment 418 extends outside of a second side of the cell boundary 1102 in the x direction by a first extension 404, and the metal segment 422 extends outside of an opposite side (third side) of the cell boundary 1102 in the x direction by a second extension 406. The extension 403 enables the power stripe 202a to be shared with an adjacent cell (e.g., a cell above the first cell). The first and the second extensions 404, 406 in the metal stripe 202e allow for an increased number of connections between the metal stripe 202e and an upper metal layer (e.g., the ML3 layer 206). In a non-limiting example, the power stripe 206e in the ML3 layer (see FIG. 11C) is configured to connect to the second voltage source to supply the second voltage signal can be connected to the first and the second extensions 404, 406 to provide the second voltage signal internally to the first cell. Additionally or alternatively, one or both of the first or the second extensions 404, 406 can be shared with an adjacent cell (e.g., a cell to the left and/or right of the first cell).

The layout 1100 also includes the first active diffusion region 208 and the second active diffusion region 210 disposed in the x direction. In one embodiment, the first and the second active diffusion regions 208, 210 include fin structures that are disposed on a substrate (not shown) and serve as active regions of the transistors (e.g., field effect transistors) in the first cell. The poly lines 212a, 212b, 212c, 212*d*, 212*e*, 212*f* are disposed below the ML1 layer in the y direction and serve as the gate electrodes of the transistors in the first cell.

Metal-to-diffusion (MD) regions 214*a*, 214*b*, 214*c*, 214*d*, 214*e*, 214*f*, 214*g*, 214*h*, 214*i*, 214*j* are disposed in the y direction over the first and/or the second active diffusion regions 208, 210 and between the poly lines 212*a*, 212*b*, 212*c*, 212*d*, 212*e*, 212*f*. In particular, the MD regions 214*a*, 214*b*, 214*c*, 214*d*, 214*e* are positioned over the first active diffusion region 208, and the MD regions 214*f*, 214*g*, 214*h*, 214*i*, 214*j* are disposed over the second active diffusion region 210.

The contacts 224*a*, 224*b*, 224*c*, 224*d* (CONTACT1) each provides a contact to a respectively poly line 212*b*, 212*c*, 212*d*, 212*e*. The contacts 220*a*, 220*b*, 220*c* (CONTACT2) each provides a contact between the MD regions 214*a*, 214*c*, 214*e*, respectively, and the metal stripe 202*b*. The contact 222*a* (CONTACT2) provides a contact between the MD region 214*f* and the metal segment 418 in the metal stripe 202*e*. The contact 222*b* (CONTACT2) provides a contact between the MD region 214*h* and the metal segment 420 in the metal stripe 202*e*. The contact 222*c* (CONTACT2) provides a contact between the MD region 214*j* and the metal segment 422 in the metal stripe 202*e*. The contact 1104*a* (CONTACT2) provides a contact between the power stripe 202*a* and the MD region 214*b*. The contact 1104*b* (CONTACT2) provides a contact between the metal stripe 202*c* and the MD region 214*d*.

FIG. 11B illustrates an example layout for a second metal layer for the first cell in accordance with some embodiments. The layout 1106 depicts the power stripe 202*a* and the metal stripes 202*b*, 202*c*, 202*d*, 202*e* of the ML1 layer disposed in the x direction. The metal stripes 204*a*, 204*b*, 204*c* of the ML2 layer are positioned in the y direction over the ML1 layer. The poly lines 212*a*, 212*b*, 212*c*, 212*d*, 212*e*, 212*f* are disposed in the y direction.

Contacts 1108*a*, 1108*b*, 1108*c*, 1108*d* each provide contacts between the ML2 layer and the ML1 layer. In particular, the contact 1108*a* is a contact between the metal stripe 204*a* and the metal stripe 202*d*. The contact 1108*b* is a contact between the metal stripe 204*b* and the metal stripe 202*c*. The contact 1108*c* is a contact between the metal stripe 204*b* and the metal stripe 202*e*. The contact 1108*d* is a contact between the metal stripe 204*c* and the metal stripe 202*d*.

In one embodiment, the locations of the CONTACT1 contacts 224*a*, 224*b*, 224*c*, 224*d* (FIG. 11A) are determined by an engineer or a designer and is in a layout initial version, and the locations of the CONTACT2 contacts 220*a*, 220*b*, 220*c*, 222*a*, 222*b*, 222*c*, 1104*a*, 1104*b*, 1108*a*, 1108*b*, 1108*c*, 1108*d* (FIGS. 11A and 11B) are determined by an electrical design automation tool and are added to the layout initial version to produce the layouts 1100 and 1106.

FIG. 11C depicts an example layout for a third metal layer for the first cell in accordance with some embodiments. The layout 1110 shows the metal stripes 204*a*, 204*b*, 204*c* of the ML2 layer positioned in the y direction and the poly lines 212*a*, 212*b*, 212*c*, 212*d*, 212*e*, 212*f* disposed in the y direction. The power stripe 206*e* of the ML3 layer is disposed in the x direction over the ML2 layer. The power stripe 206*e* extends outside of the cell boundary 1102 in the y direction by an extension 1112 and is shared by an adjacent cell (e.g., a cell below the first cell). The power stripe 206*e* provides the second voltage signal (e.g., VSS or ground) to the first cell.

FIGS. 12A-12C illustrate an example cell structure for a second cell in accordance with some embodiments. In a non-limiting example, the second cell can be implemented as an inverter circuit. FIG. 12A illustrates an example layout for a first metal layer in the second cell in accordance with some embodiments. The layout 1200 includes the power stripe 202*a* and the metal stripes 202*b*, 202*c*, 202*d*, 202*e* of the ML1 layer disposed in the x direction. Like FIG. 11A, the power stripe 202*a* is operable to connect to a first voltage source (e.g., VDD) to supply a first voltage signal and the metal stripes 202*b*, 202*c*, 202*d* are used for various signals. In the illustrated embodiment, the metal stripe 202*e* is an uninterrupted metal stripe that is not divided into metal segments. The metal stripe 202*e* is used as an internal signal line for a second voltage signal (e.g., VSS or ground).

As shown, for power routing, the power stripe 202*a* extends outside of a first side of the cell boundary 1202 in the y direction by an extension 403 and the metal stripe 202*e* extends outside of a second side of the cell boundary 1202 in the x direction by a first extension 404 and outside an opposite side (e.g., third side) of the cell boundary 1202 in the x direction by a second extension 406. The extension 403 enables the power stripe 202*a* to be shared with an adjacent cell (e.g., a cell above the second cell). The first and the second extensions 404, 406 allow for an increased number of connections between the metal stripe 202*e* and an upper metal layer (e.g., the ML3 layer 206). In a non-limiting example, the power stripe 206*e* in the ML3 layer (FIG. 12C) that is operable to connect to the second voltage source to supply the second voltage signal can be connected to the first and the second extensions 404, 406 to provide the second voltage signal internally to the second cell. Additionally or alternatively, one or both of the first or the second extensions 404, 406 can be shared with an adjacent cell (e.g., a cell to the left and/or right of the second cell). The length of the first extension 404 can be equal to, or different from, the length of the second extension 406.

The layout 1200 also includes the first active diffusion region 208 and the second active diffusion region 210 disposed in the x direction. In one embodiment, the first and the second active diffusion regions 208, 210 include fin structures that are disposed on a substrate (not shown) and serve as active regions of the transistors (e.g., field effect transistors) in the second cell. The poly lines 212*a*, 212*b*, 212*c* are disposed below the ML1 layer in the y direction and serve as the gate electrodes of the transistors in the second cell.

Metal-to-diffusion (MD) regions 214*a*, 214*b*, 214*c* are disposed in the y direction over the first and/or the second active diffusion regions 208, 210 and between the poly lines 212*a*, 212*b*, 212*c*. In particular, the MD region 214*a* is positioned over the first active diffusion region 208 and the second active diffusion region 210. The MD region 214*b* is disposed over the first active diffusion region 208, and the MD region 214*c* positioned over the second active diffusion region 210.

The contact 224*a* (CONTACT1) provides a contact to the poly line 212*b*. The contact 220*a* (CONTACT2) provides a contact between the MD region 214*a* and the metal stripe 202*b*. The contact 222*a* (CONTACT2) provides a contact between the MD region 214*c* and the metal stripe 202*e*. The contact 1104*a* (CONTACT2) provides a contact between the power stripe 202*a* and the MD region 214*b*.

FIG. 12B depicts an example layout for a second metal layer for the second cell in accordance with some embodiments. The layout 1204 depicts the power stripe 202*a* and the metal stripes 202*b*, 202*c*, 202*d*, 202*e* of the ML1 layer disposed in the x direction. The metal stripe 204*a* of the ML2 layer is positioned in the y direction over the ML1 layer. The poly lines 212a, 212b, 212c are disposed in the y direction.

Contact (CONTACT2) 1108a provides a contact between the metal stripe 204a in the ML2 layer and the metal stripe 202b in the ML1 layer. In one embodiment, the location of the CONTACT1 contact 224a (FIG. 12A) is determined by an engineer or a designer and is in a layout initial version, and the locations of the CONTACT2 contacts 220a, 222a, 1104a, 1108a are determined by an electrical design automation tool and are added to the layout initial version to produce the layouts 1200 and 1204.

FIG. 12C illustrates an example layout for a third metal layer for the second cell in accordance with some embodiments. The layout 1206 shows the metal stripe 204a of the ML2 layer positioned in the y direction and the poly lines 212a, 212b, 212c disposed in the y direction. The power stripe 206e of the ML3 layer is disposed in the x direction over the ML2 layer. The power stripe 206e provides the second voltage signal (e.g., VSS or ground) to the second cell. The power stripe 206e extends outside of a fourth side of the cell boundary 1202 in the y direction by an extension 1112 such that the power stripe 206e is shared by an adjacent cell (e.g., a cell below the second cell).

Figure 13A:
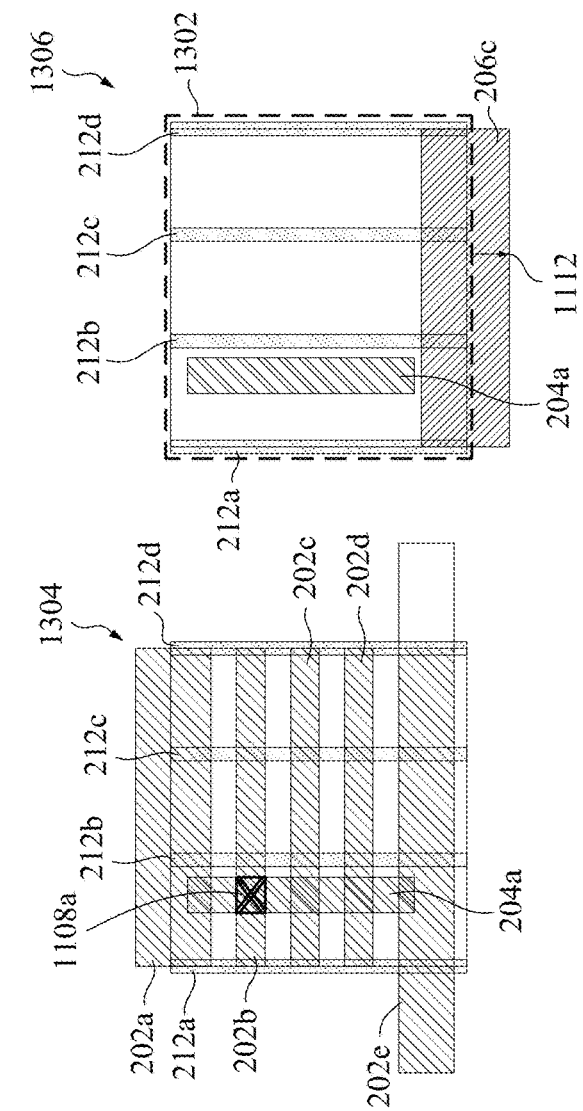
FIG. 13A depicts an example layout for a first metal layer for a third cell in accordance with some embodiments.
Figure 13B:
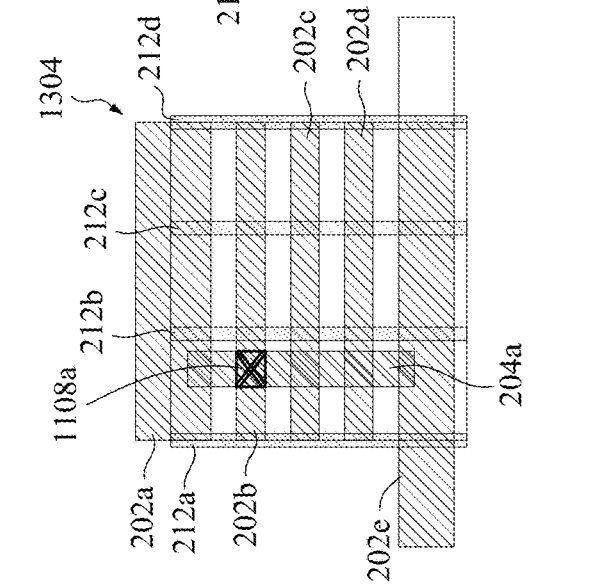
FIG. 13B illustrates an example layout for a second metal layer for the third cell in accordance with some embodiments.
Figure 13C:
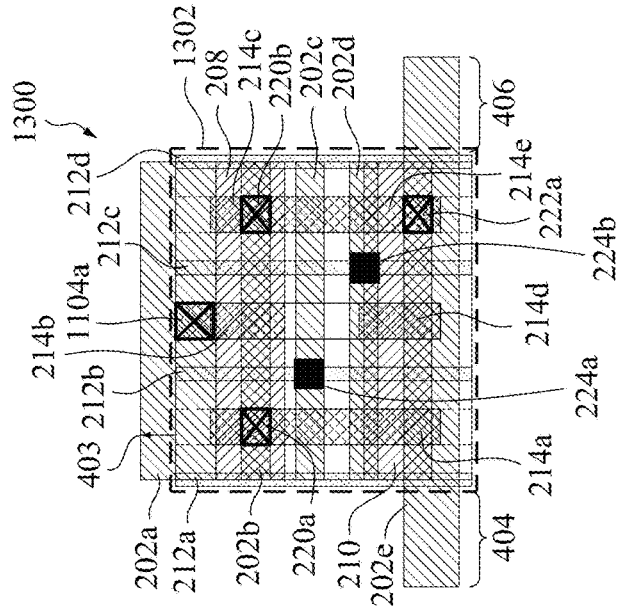
FIG. 13C depicts an example layout for a third metal layer for the third cell in accordance with some embodiments.

FIGS. 13A-13C illustrate an example cell structure for a third cell in accordance with some embodiments. In a non-limiting example, the third cell can be implemented as a NAND circuit. FIG. 13A depicts an example layout for a first metal layer for the third cell in accordance with some embodiments. The layout 1300 includes the power stripe 202a and the metal stripes 202b, 202c, 202d, 202e of the ML1 layer disposed in the x direction. The power stripe 202a is operable to connect to a first voltage source (e.g., VDD) to supply a first voltage signal and the metal stripes 202b, 202c, 202d are used for various signals. Like FIG. 12A, the metal stripe 202e is an uninterrupted stripe that is used as an internal signal line for a second voltage signal (e.g., VSS or ground).

As shown, for power routing, the power stripe 202a extends outside of a first side of the cell boundary 1302 in the y direction by an extension 403 and the metal stripe 202e extends outside of a second side of the cell boundary 1302 in the x direction by a first extension 404 and outside an opposite side (e.g., third side) of the cell boundary 1302 in the x direction by a second extension 406. The extension 403 enables the power stripe 202a to be shared with an adjacent cell (e.g., a cell above the third cell). The first and the second extensions 404, 406 in the metal stripe 202e allow for an increased number of connections between the metal stripe 202e and an upper metal layer (e.g., the ML3 layer 206). In a non-limiting example, the metal stripe 206e in the ML3 layer (FIG. 13C) that is configured to connect to the second voltage source to supply the second voltage signal can be connected to the first and the second extensions 404, 406 to provide the second voltage signal internally to the first cell. Additionally or alternatively, one or both of the first or the second extensions 404, 406 can be shared with an adjacent cell (e.g., a cell to the left and/or the right of the third cell). The length of the first extension 404 can be equal to, or different from, the length of the second extension 406.

The layout 1300 also includes the first active diffusion region 208 and the second active diffusion region 210 disposed in the x direction. In one embodiment, the first and the second active diffusion regions 208, 210 include fin structures that are disposed on a substrate (not shown) and serve as active regions of the transistors (e.g., field effect transistors) in the third cell. The poly lines 212a, 212b, 212c, 212d are disposed below the ML1 layer in the y direction and serve as the gate electrodes of the transistors in the second cell.

Metal-to-diffusion (MD) regions 214a, 214b, 214c, 214d, 214e are disposed in the y direction over the first and/or the second active diffusion regions 208, 210 and between the poly lines 212a, 212b, 212c, 212d. In particular, the MD region 214a is positioned over the first active diffusion region 208 and the second active diffusion region 210. The MD regions 214b, 214c are disposed over the first active diffusion region 208, and the MD regions 214d, 214e are positioned over the second active diffusion region 210.

The contacts 224a, 224b (CONTACT1) each provides a contact to a respective poly line 212b, 212c. The contact 220a (CONTACT2) provides a contact between the MD region 214a and the metal stripe 202b. The contact 220b (CONTACT2) provides a contact between the MD region 214c and the metal stripe 202b. The contact 222a (CONTACT2) provides a contact between the MD region 214e and the metal stripe 202e. The contact 1104a (CONTACT2) provides a contact between the power stripe 202a and the MD region 214b.

FIG. 13B illustrates an example layout for a second metal layer for the third cell in accordance with some embodiments. The layout 1304 depicts the power stripe 202a and the metal stripes 202b, 202c, 202d, 202e of the ML1 layer disposed in the x direction. The metal stripe 204a of the ML2 layer is positioned in the y direction over the ML1 layer. The poly lines 212a, 212b, 212c, 212d are disposed in the y direction.

Contact 1108a provides a contact between the metal stripe 204a in the ML2 layer and the metal stripe 202b in the ML1 layer. In one embodiment, the location of the CONTACT1 contacts 224a, 224b (FIG. 13A) are determined by an engineer or a designer and are in a layout initial version, and the locations of the CONTACT2 contacts 220a, 220b, 222a, 1104a, 1108a are determined by an electrical design automation tool and are added to the layout initial version to produce the layouts 1300 and 1304.

FIG. 13C depicts an example layout for a third metal layer for the third cell in accordance with some embodiments. The layout 1306 shows the metal stripe 204a of the ML2 layer positioned in the y direction and the poly lines 212a, 212b, 212c, 212d disposed in the y direction. The power stripe 206e of the ML3 layer is disposed in the x direction over the ML2 layer. The power stripe 206e is operable to connect to the second voltage source to supply the second voltage signal (e.g., VSS or ground) to the third cell. The power stripe 206e extends outside of a fourth side of the cell boundary 1302 in they direction by an extension 1112 and is shared by an adjacent cell (e.g., a cell below the third cell).

FIG. 14A illustrates an example layout for a power distribution network for an integrated circuit in accordance with some embodiments. FIG. 14A is described in conjunction with FIGS. 14B and 14C. FIG. 14B depicts an example layout for the power stripes in the first metal layer of a fourth cell, and FIG. 14C illustrates an expanded view of a portion of the example layout shown in FIG. 14A in accordance with some embodiments.

In some embodiments, the power distribution network is created prior to placing the fourth cell on the chip. The layout 1400 includes two first power stripes 1402_PG of the ML1 layer disposed in the x direction. A second power stripe 1404_PG of the ML3 layer is disposed in the x direction. As shown, the second power stripe 1404_PG is positioned between the two first power stripes 1402_PG. In a non-limiting example, the first power stripes 1402_PG are the power stripe 202a shown in FIG. 2, and the second power stripe 1404_PG is the power stripe 206e shown in FIG. 2.

FIG. 14B depicts the first power stripe 1402_cell in the fourth cell 1406, and FIG. 14C is an expanded view of the area 1407 shown in FIG. 14A. FIG. 14C illustrates the second power stripe 1404_cell in the fourth cell. To position the fourth cell 1406 at the correct location on the chip, the 1402_cell and the 1404_cell are aligned with the 1402_PG and the 1404_PG such that the 1402_cell and the 1404_cell overlap the 1402_PG and the 1404_PG. The 1402_cell and the 1404_cell connect with the 1402_PG and the 1404_PG.

The layout 1400 further depicts an example method of connecting the ML3 layer to the first power stripe 1402_PG to provide the first voltage signal (e.g., VDD) to the ML3 layer. As shown in FIG. 14A, M3 pillars 1408 are formed in the ML3 layer and are disposed in the x direction. The M3 pillars 1408 are short metal segments and are used to provide the connections to the first power stripe 1402_PG. The M3 pillars 1408 occupy or consume less routing resources.

Metal stripes 1410 of the ML2 layer are disposed in the y direction and connect the M3 pillars 1408 in the ML3 layer to the first power stripe 1402_PG. The metal stripes 1410 can provide the cell power connection or PG connection with lower resistance. In a non-limiting example, the cell power connections are determined by an electronic design automation tool. In one embodiment, the width of the second power stripe 1404_cell ML3_PW(VSS)=1~2×(the width of the M1 pillars (ML1_PW(VSS)).

Figure 15:
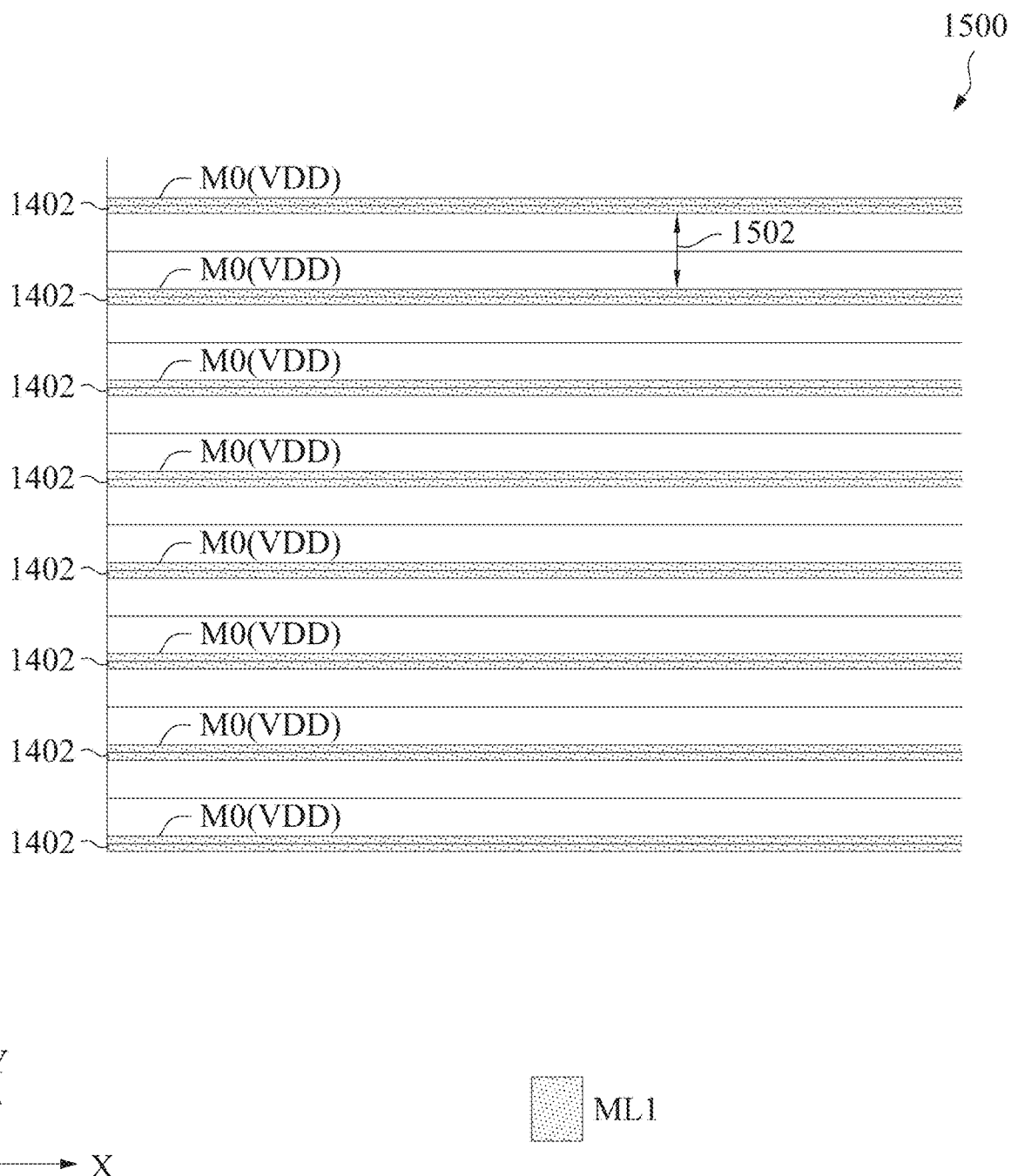
FIG. 15 depicts an example layout for a first power structure definition for the first power stripe shown in FIG. 14A in accordance with some embodiments.

FIG. 15 depicts an example layout for a first power structure definition for the first power stripe shown in FIG. 14A in accordance with some embodiments. The layout 1500 includes multiple first power stripes 1402 (e.g., power stripes 202a) disposed in the x direction. In the illustrated embodiment, the pitch 1502 of the first power stripes 1402 is (2×CH), although other embodiments are not limited to this pitch. Also, the representative layout 1500 does not include a power stripe in the ML1 layer for the second voltage signal (e.g., VSS or ground).

Figure 16:
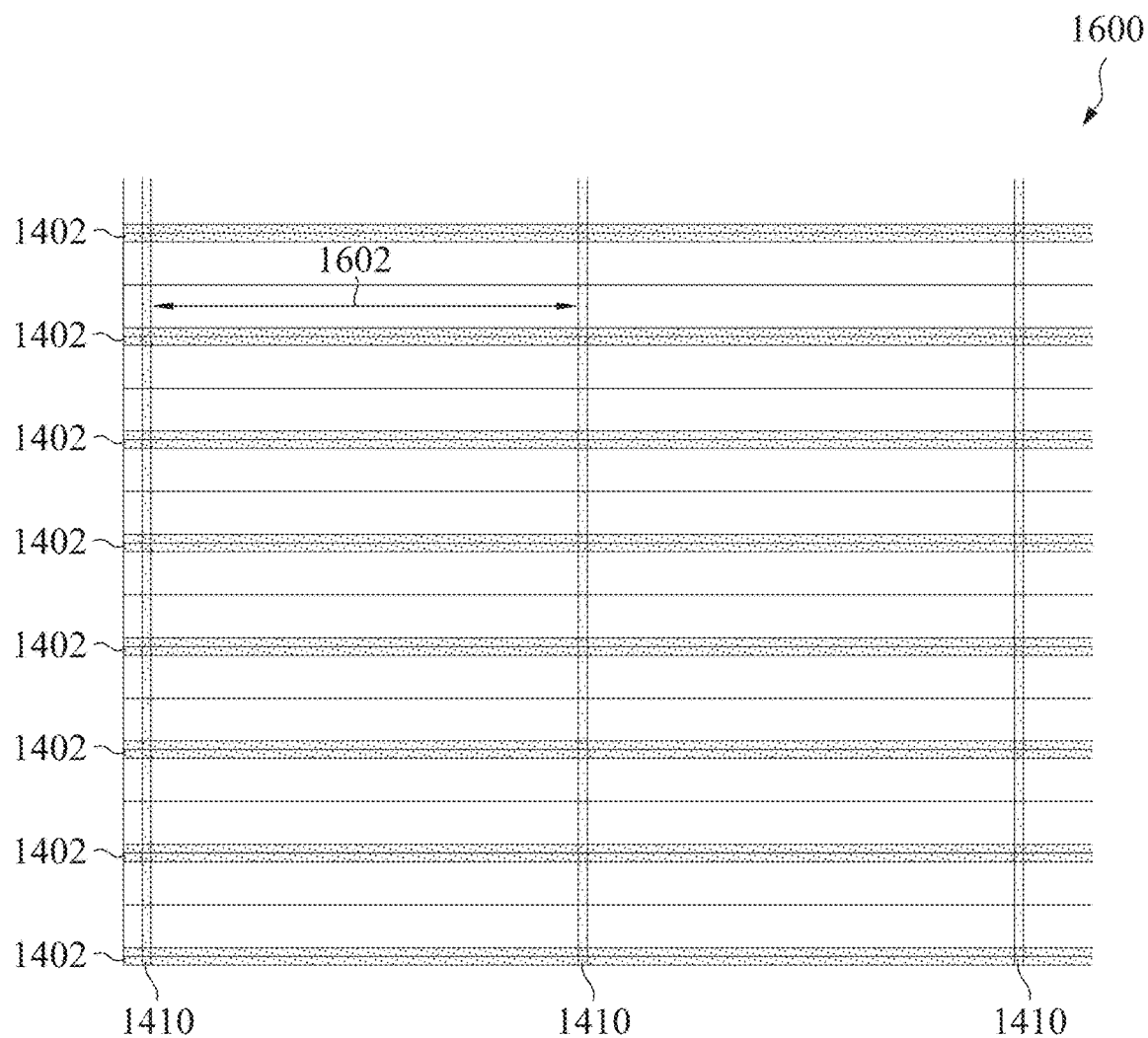
FIG. 16 illustrates an example layout for a second power structure definition for the metal stripes in the second metal layer shown in FIG. 14A in accordance with some embodiments.

FIG. 16 illustrates an example layout for a second power structure definition for the metal stripes in the second metal layer shown in FIG. 14A in accordance with some embodiments. The layout 1600 includes the first power stripes 1402 in the ML1 layer disposed in the x direction and the metal stripes 1410 in the ML2 layer positioned in the y direction. In the illustrated embodiment, the metal stripes 1410 provide the first voltage signal (e.g., VDD) and the pitch 1602 of the metal stripes 1410 is approximately 16 to 24 of the poly pitch, although other embodiments are not limited to this pitch. Also, the representative layout 1600 does not depict the metal stripes in the ML2 layer for the second voltage signal (e.g., VSS or ground) because, in one embodiment, the metal stripes for the second voltage signal are designed by an electrical design automation tool.

Figure 17:
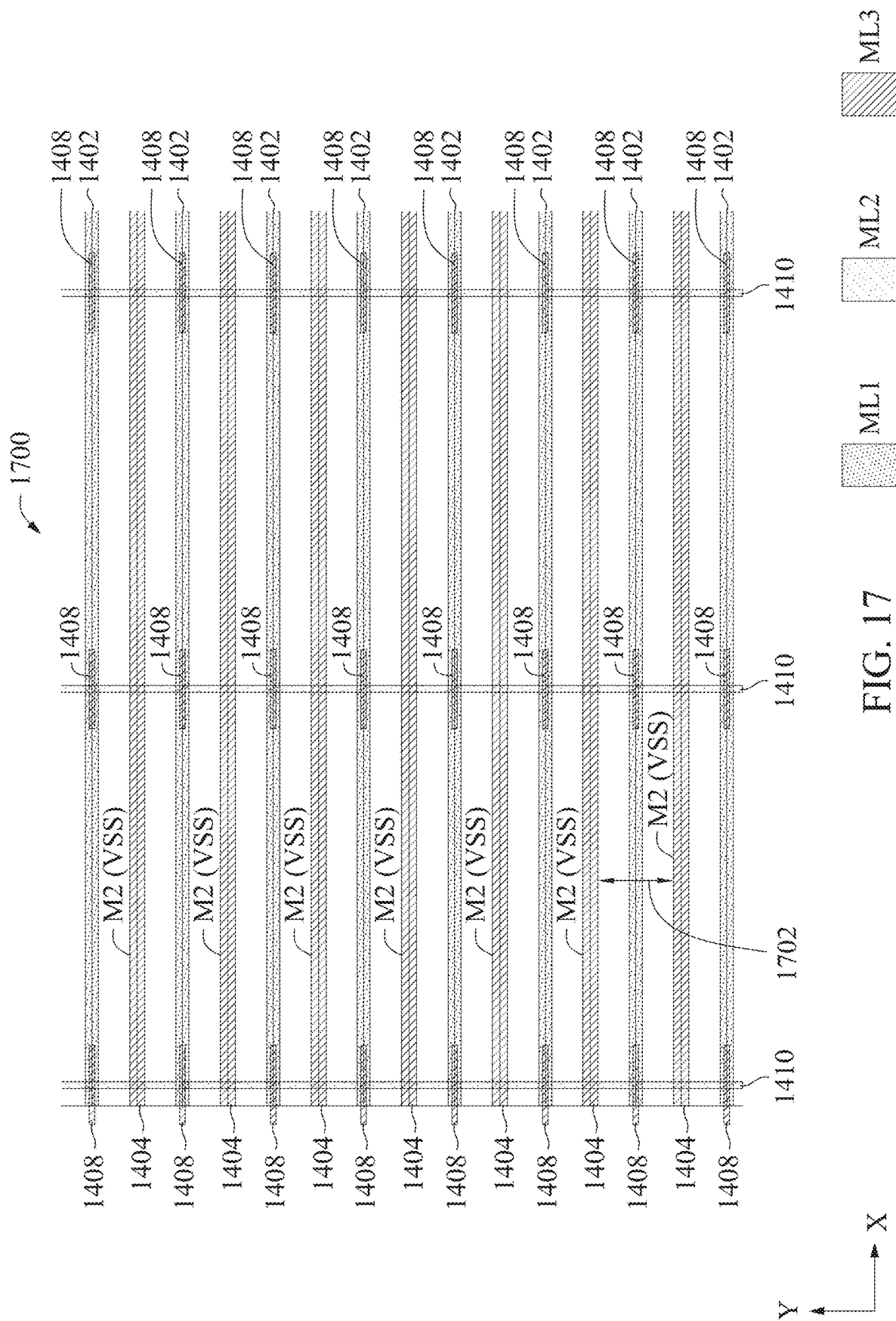
FIG. 17 depicts an example layout for a third power structure definition for the second power stripes shown in FIG. 14A in accordance with some embodiments.

FIG. 17 depicts an example layout for a third power structure definition for the second power stripes shown in FIG. 14A in accordance with some embodiments. The layout 1700 includes the first power stripes 1402 in the ML1 layer, the metal stripes 1410 in the ML2 layer, the second power stripes 1404 in the ML3 layer, and the M3 pillars 1408. In the illustrated embodiment, the pitch 1702 of the second power stripes 1404 is (2×CH), although other embodiments are not limited to this pitch. Also, the representative layout 1700 does not depict the metal stripes in the ML2 layer for the second voltage signal (e.g., VSS or ground), any contacts to the power stripes 1404, and any additional contacts to the M3 pillars because, in some embodiments, the metal stripes for the second voltage signal, the contacts to the power stripes 1404, the additional contacts to the M3 pillars are designed by an electrical design automation tool.

Figure 18:
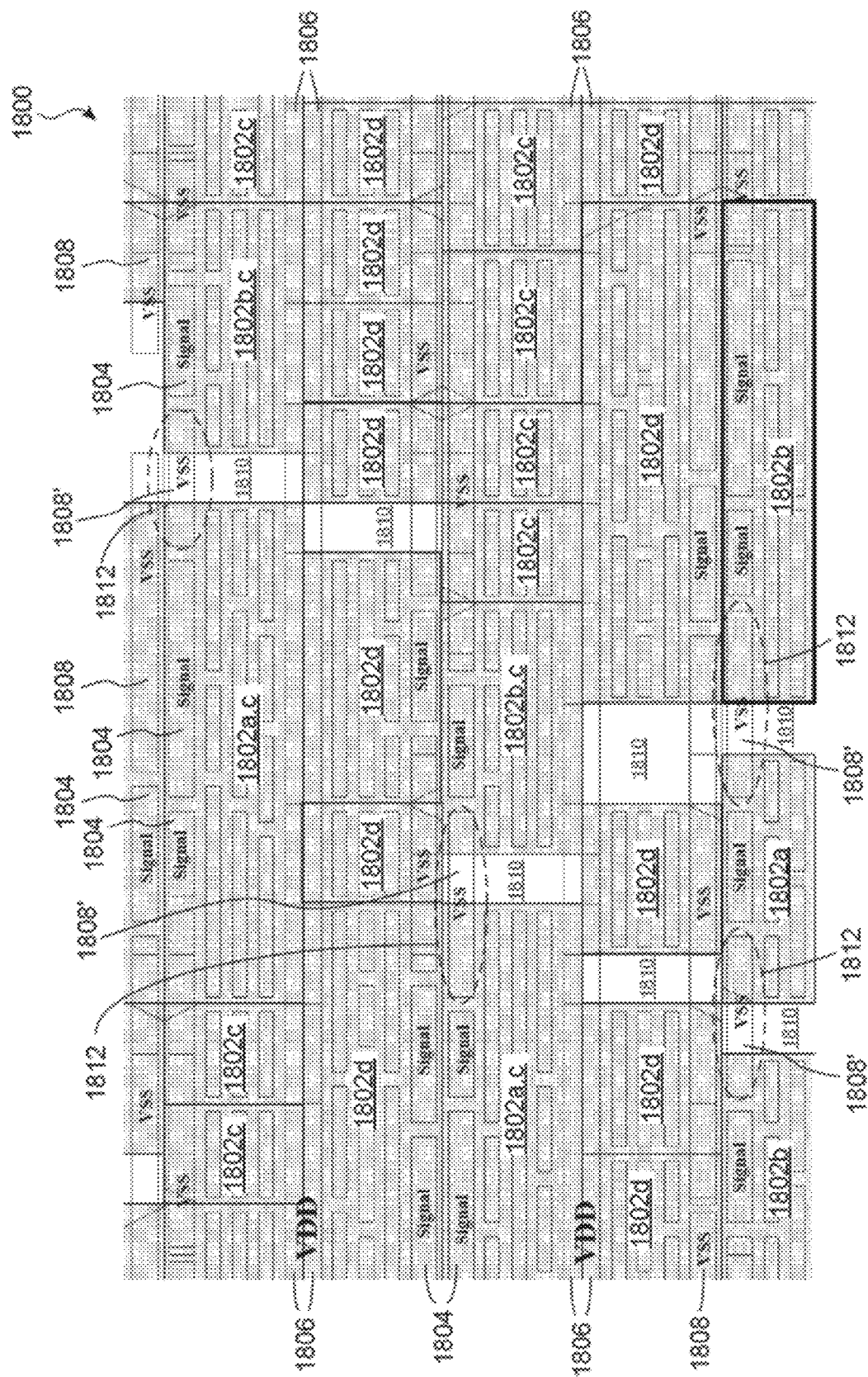
FIG. 18 illustrates a section of an integrated circuit that includes filler cells and extended metal stripes for the second voltage signal in accordance with some embodiments.

FIG. 18 illustrates a layout of a section of an integrated circuit that includes filler cells and extended metal stripes for the second voltage signal in accordance with some embodiments. The layout 1800 includes cells 1802, signal lines 1804, first power stripes 1806 (e.g., 202a in FIG. 2) for the first voltage signal (e.g., VDD), and second power stripes 1808 (e.g., 206e in FIG. 2) for the second voltage signal (e.g., VSS or ground). In one embodiment, the cells 1802 can include the first power stripe 202a as shown in the layout of FIG. 4, and the depicted signal lines 1804, first power stripes 1806, and second power stripes 1808 may be in the ML1 layer.

The layout 1800 further includes filler cells 1810. The filler cells 1810 include all of the components in a cell 1802, but the filler cells 1810 do not contain the connections between the active area and the metal layers. The filler cells 1810 are used to maintain the layer density to improve the yield during the fabrication/processing operations.

Figure 19:
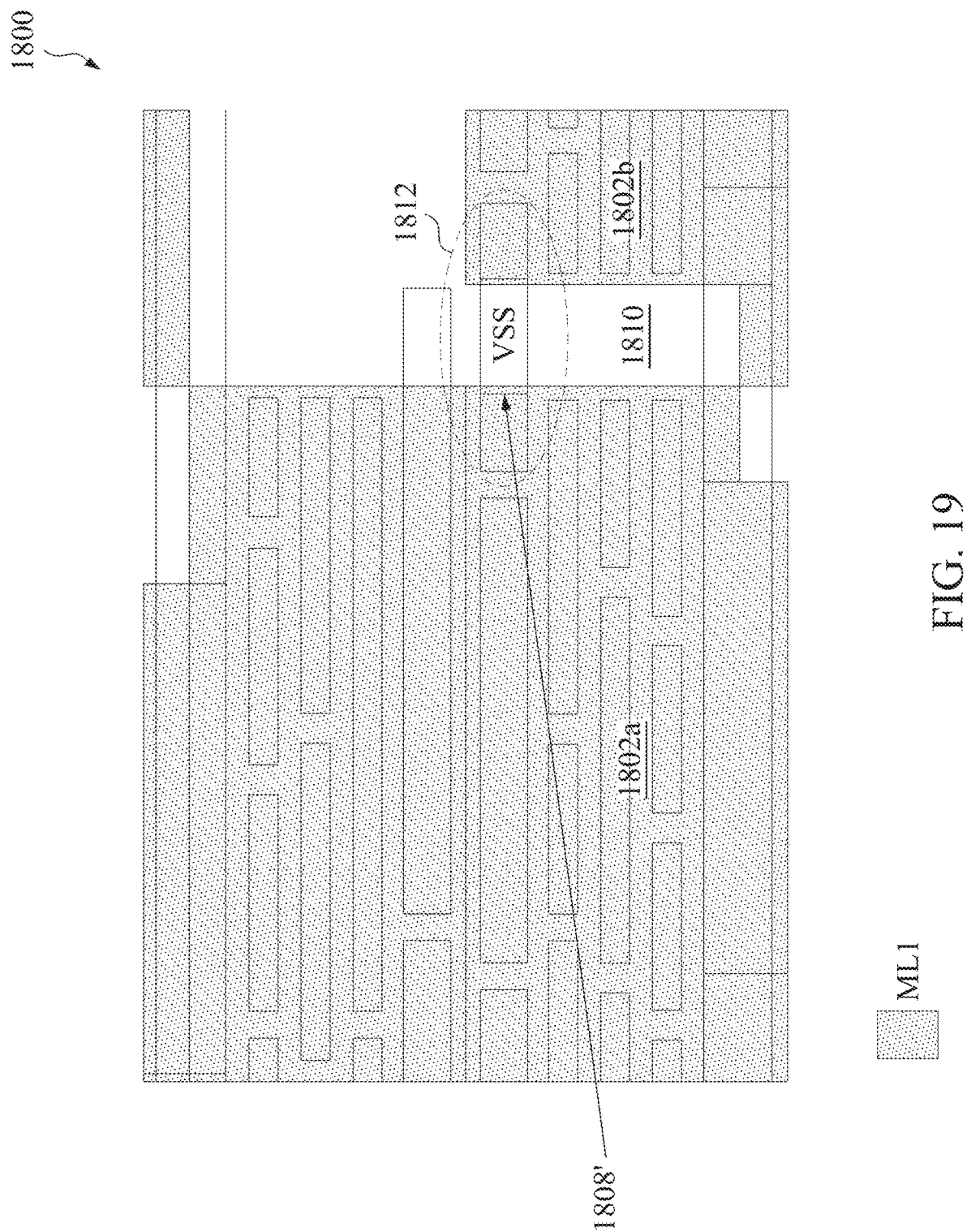
FIG. 19 depicts an expanded view of an extended metal stripe for the second voltage signal in accordance with some embodiments.

In some instances, the second power stripe 1808 is shared by two adjacent cells (see FIG. 19). As shown in the areas within the dashed ellipses 1812, the shared second power stripe 1808' extends across a filler cell 1810 to two adjacent cells 1802a, 1802b. In one embodiment, the shared power stripe 1808' includes (or is formed by) the first and the second extensions 404, 406 in FIG. 4. For example, a metal segment 422 in one cell 1802a and a metal segment 418 in an adjacent cell 1802b form (or are included in) the one segment 1808', and the one segment 1808' resides in the two adjacent cells 1802a, 1802b and in the respective filler cells 1810. Additionally or alternatively, the first power stripe 1806 (e.g., first power stripe 202a in FIG. 4) is shared by and resides in adjacent cells 1802c, 1802d.

Figure 20:
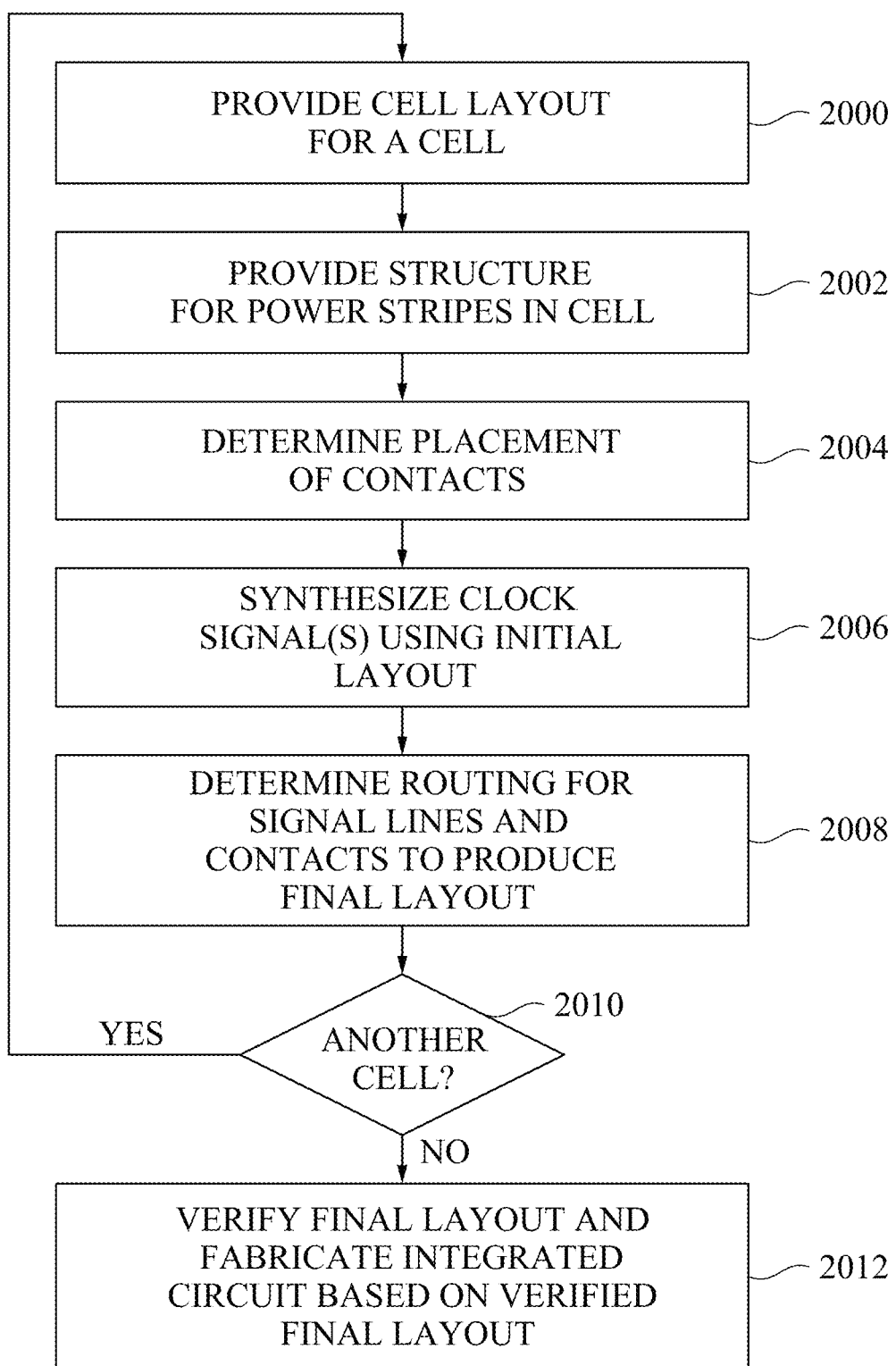
FIG. 20 illustrates a flowchart of a method of fabricating a cell in an integrated circuit in accordance with some embodiments.

FIG. 20 depicts a flowchart of a method to design cells in an integrated circuit in accordance with some embodiments. Initially, a cell layout for the cell is (caused to be) received or provided (block 2000). The cell layout can include the metal stripes for the different metal layers (e.g., ML1, ML2, ML3 layers) for a particular cell type, where the cell type can be the type of component the cell is associated with in the integrated circuit. Example cell types include, but are not limited to, AND, NOR, NAND, OR, and inverter circuits.

Next, as shown in block 2002, the power structures in the cell are provided or received (or caused to be received). The power structures define the layout of the power stripes that supply the voltage signal(s) in the cell. Embodiments described herein include a first voltage signal (e.g., VDD) and a second voltage signal (VSS or ground). Example power structures are described in conjunction with FIGS. 15-17.

The placement of one or more contacts are determined or caused to be determined at block 2004. Example contacts include contacts to metal stripes, power stripes, poly lines, and/or active diffusion regions. An initial layout is produced after the completion of block 2004.

One or more clock signals for the initial layout are synthesized (or caused to be synthesized) at block 2006. In one embodiment, the clock signal(s) are synthesized using an electrical design automation tool. The clock signals are synthesized so the functionality, and any issues in the functionality, of the initial layout can be determined. For example, it can be determined whether a first or a second extension in a power stripe for the second voltage signal (e.g., extensions 404 or 406 in FIG. 4) in the ML1 layer contacts a metal stripe used for a signal, which can cause operational issues for the cell.

Once the one or more clock signals are synthesized, the routing for the metal stripes used for signals and/or additional contacts are determined (or caused to be determined) at block 2008 to produce a final layout. In one embodiment, block 2008 is performed by the electrical design automation tool while the electrical design automation tool synthesizes the clock signal(s).

A determination is made at block 2010 as to whether another cell of the same or of a different cell type is to be processed. If so, the method returns to block 2000 and blocks 2000, 2002, 2004, 2006, 2008, 2010 repeat until all of the cells have been designed or processed. When all of the cells have been designed, the process continues at block 2012 where the final layouts for all of the cells collectively form the final layout for the IC. The final layout for the IC is verified and the IC is fabricated based on the final layout.

Figure 21:
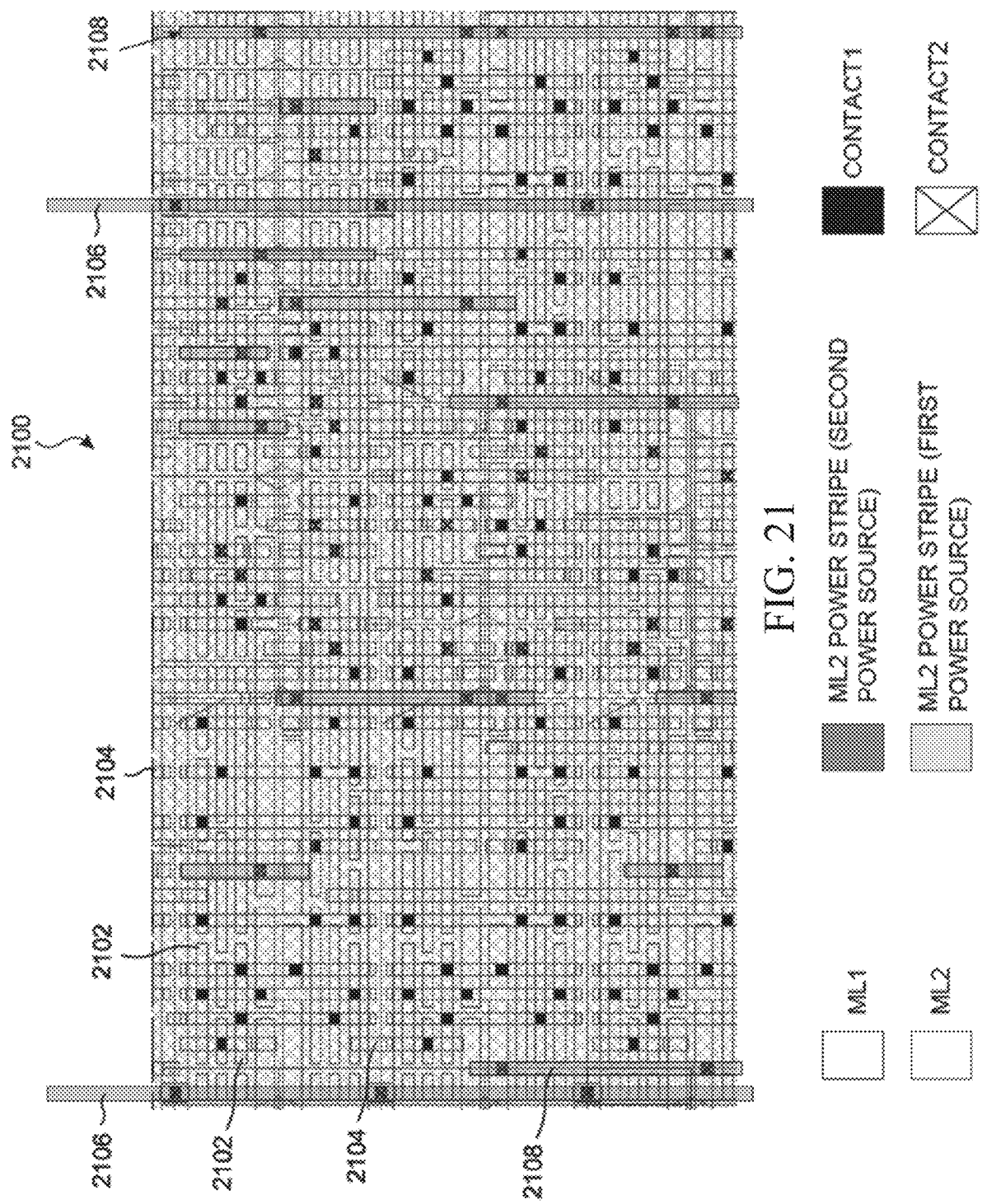
FIG. 21 depicts an example power routing for a ML1 layer and a ML2 layer in an integrated circuit in accordance with some embodiments.

FIG. 21 illustrates an example power routing for a ML1 layer and a ML2 layer in an integrated circuit in accordance with some embodiments. The power routing 2100 depicts the routing of the metal stripes 2102 in the ML1 layer and the metal stripes 2104 in the ML2 layer. The power stripes 2106 in the ML2 layer are configured to supply the first voltage signal (e.g., VDD), and the power stripes 2108 in the ML2 layer are configured to provide the second voltage signal (e.g., VSS or ground). Contacts 2110 and contacts 2112 provide contacts between a metal stripe 2102 in the ML1 layer and either a metal stripe 2104 or a power stripe 2106, 2108 in the ML2 layer. As described earlier, the placement of the contacts 2112 can be determined by an electrical design automation tool.

Figure 22:
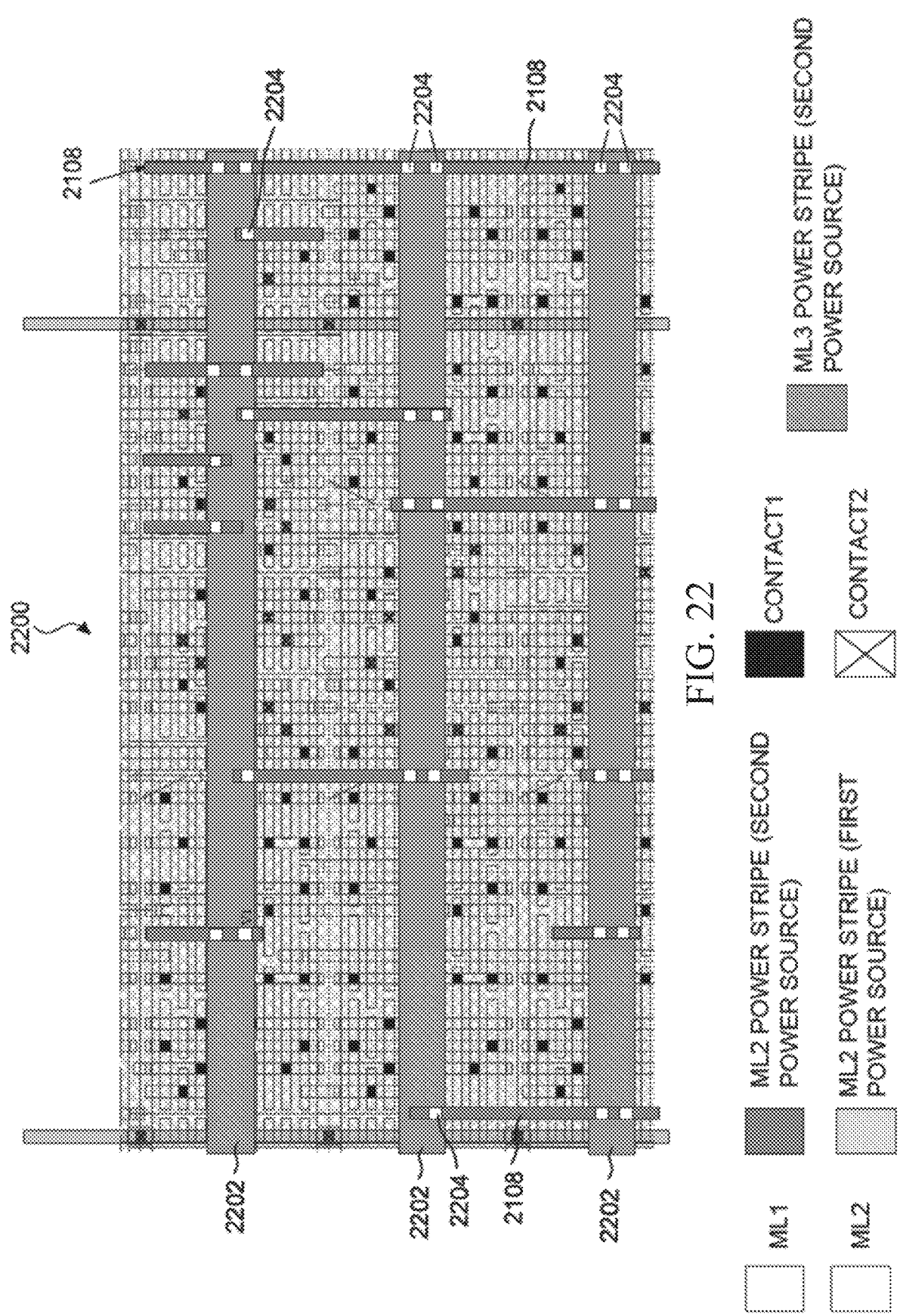
FIG. 22 illustrates an example power routing for a ML3 layer in the integrated circuit shown in FIG. 21 in accordance with some embodiments.

FIG. 22 depicts an example power routing for a ML3 layer in the integrated circuit shown in FIG. 21 in accordance with some embodiments. The layout 2200 includes the metal stripes, power stripes, and contacts in the ML1 and the ML2 layers, and depicts the example routing of the power stripes in the ML3 layer. In one embodiment, the power stripes 2202 are operable to provide the second voltage signal (e.g., VSS or ground). The second voltage signal is supplied to the power stripes via contacts 2204 to the power stripes 2108 (e.g., metal stripes 202e in FIG. 2) in the ML1 layer. In FIG. 22, the power stripes 2108 are shown above the power stripes 2202 to emphasize the power stripes 2108. In practice the power stripes 2108 are formed below the power stripes 2202 since the power stripes 2108 are in the ML2 layer and the power stripes 2202 are in the ML3 layer.

Figure 23:
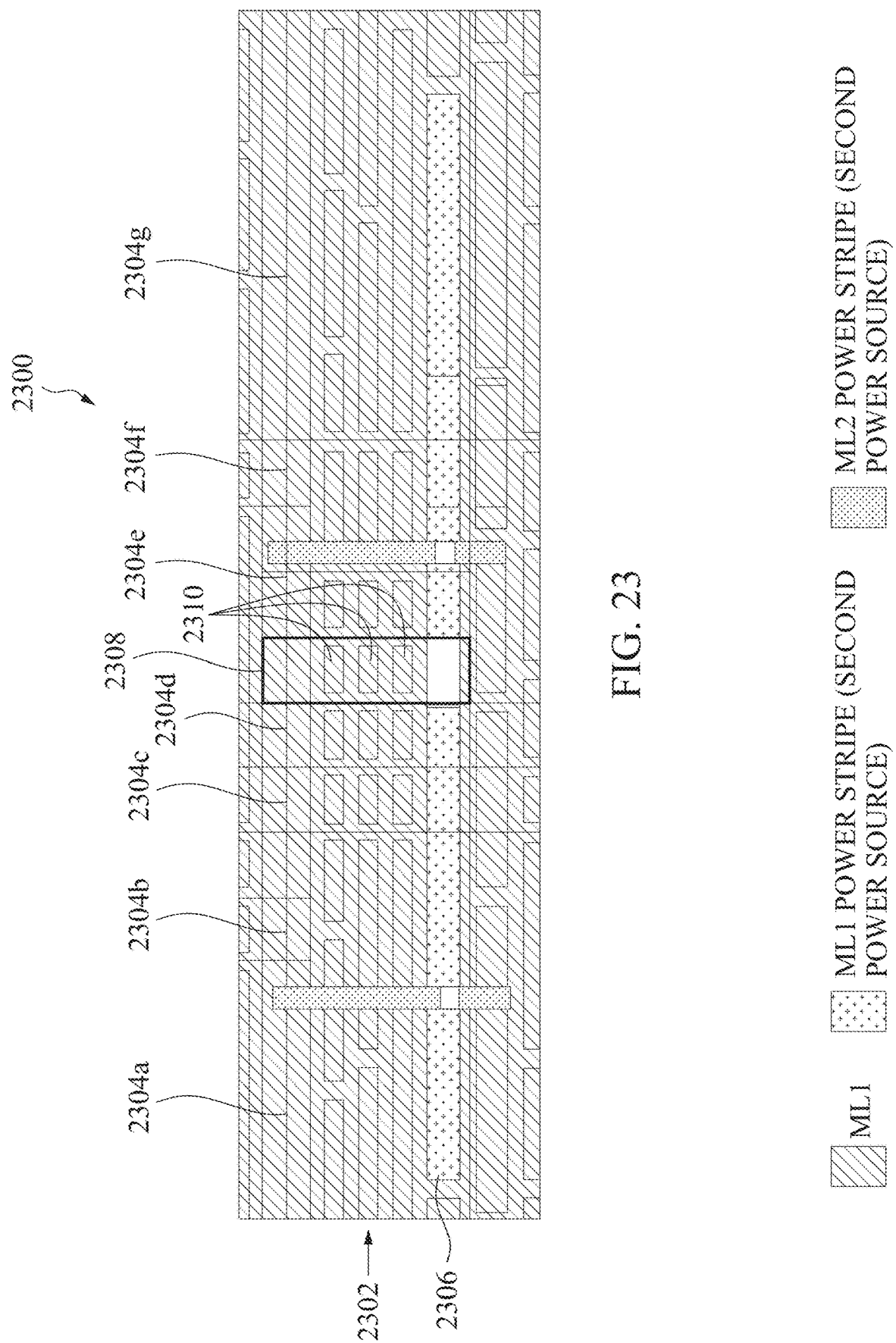
FIG. 23 depicts a first layout of an integrated circuit that is used to describe a method of reducing the IR drop across a power stripe in accordance with some embodiments.

FIG. 23 illustrates a first layout of an integrated circuit that is used to describe a method of reducing the IR drop across a power stripe in accordance with some embodiments. In one embodiment, a filler cell can be used to reduce the length of a power stripe, which reduces the IR drop across the power stripe. As shown in FIG. 23, the layout 2300 includes a line 2302 of cells 2304a, 2304b, 2304c, 2304d, 2304e, 2304f, 2304g. A metal stripe 2306 in the ML1 layer (e.g., metal stripe 202e in FIG. 2) is physically cut by inserting a filler cell 2308 that has non-operating components. The filler cell 2308 divides the metal stripe 2306 into multiple metal segments. The example filler cell 2308 includes the metal stripes 2310 in the ML1 layer but does not include the metal stripe 2306.

Figures 24, 25:
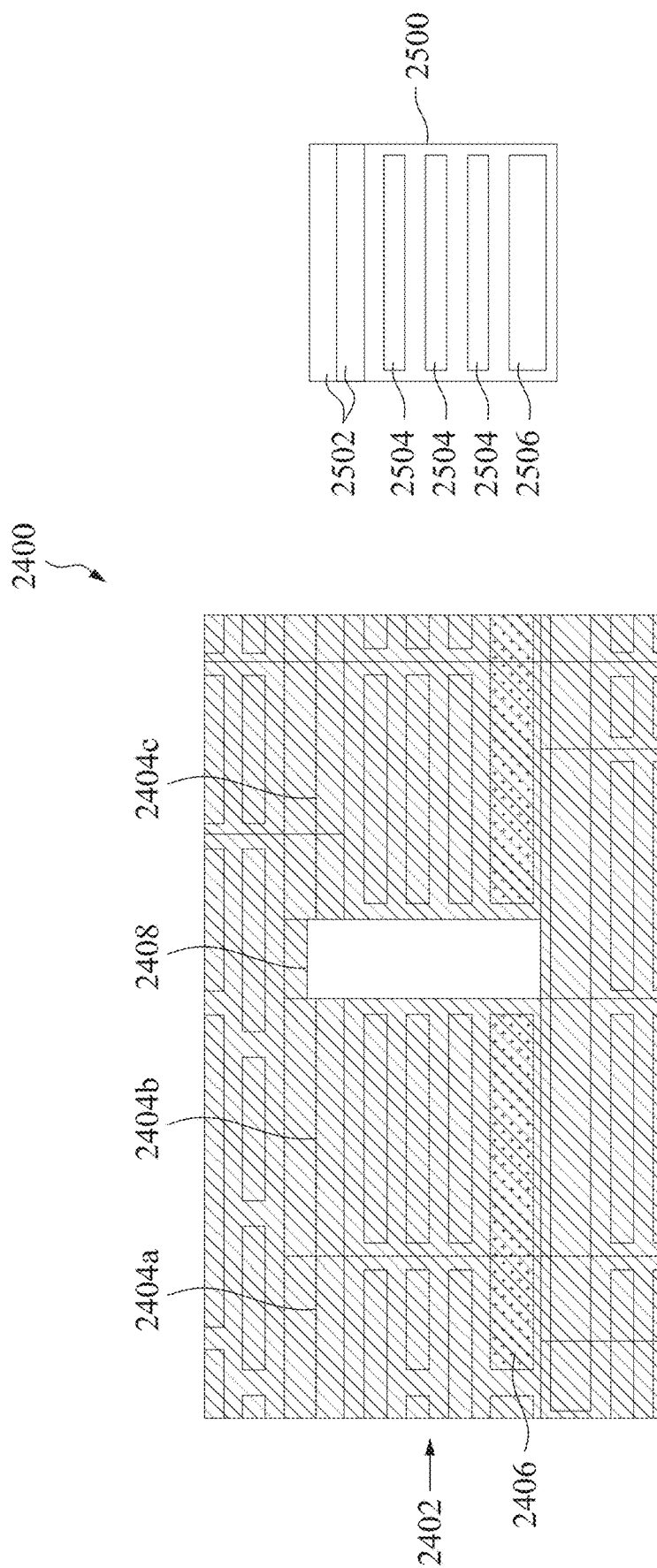
FIG. 24 illustrates a second layout of an integrated circuit that is used to describe another method of reducing the IR drop across a power stripe in accordance with some embodiments.
FIG. 25 depicts a cell in the layout shown in FIG. 24 in accordance with some embodiments.

In some instances, a filler cell that does not include a metal layer can be used to reduce the IR drop across a power stripe. FIG. 24 depicts a second layout of an integrated circuit that is used to describe another method of reducing the IR drop across a power stripe in accordance with some embodiments. The layout 2400 includes a line 2402 of cells 2404a, 2404b, 2404c. A metal stripe 2406 (e.g., metal stripe 202e in FIG. 2) in the ML1 layer is operable to connect to the second voltage source to supply the second voltage signal (e.g., VSS or ground). A filler cell 2408 is used to break the metal stripe 2406 (e.g., separate into multiple metal segments). The illustrated filler cell 2408 does not include any metal stripes in the ML1 layer.

FIG. 25 illustrates a cell in the layout shown in FIG. 24 in accordance with some embodiments. The cell 2500 includes a first power stripe 2502 (e.g., power stripe 202a in FIG. 2) that is operable to connect to the first voltage source to supply the first voltage signal and the metal stripes 2504 that are used for signals. The metal stripe 2506 (e.g., metal stripe 202e in FIG. 2) in the ML1 layer for the second voltage signal is also in the cell 2500. In the illustrated embodiment, the first power stripe 2502 is shared with a cell that is above and abuts the cell 2500, but the metal stripe 2506 does not include any extensions (e.g., extensions 404, 406 in FIG. 4).

Figure 26:
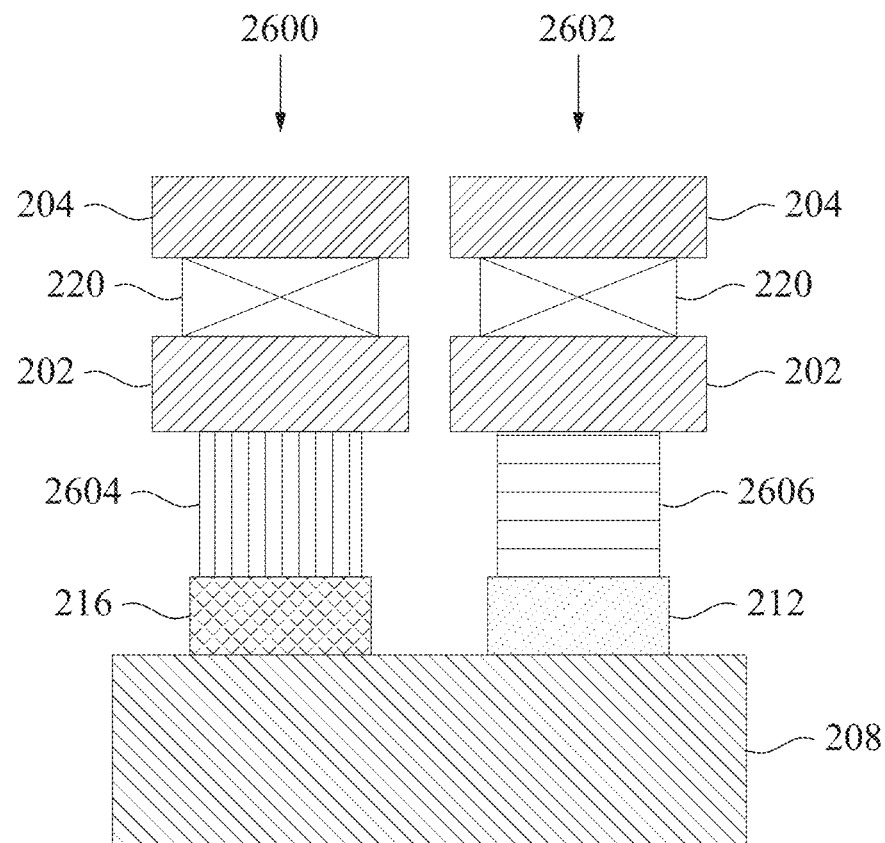
FIG. 26 illustrates various layers in a cell and the connections between an active diffusion region and a top metal layer in the cell in accordance with some embodiments.

FIG. 26 depicts various layers in a cell and the connections between an active diffusion region and a top metal layer in the cell in accordance with some embodiments. In the illustrated embodiment, the top metal layer is the ML2 layer. FIG. 26 shows the MD region to the ML2 layer connection as a first connection structure 2600 and the poly line to the ML2 layer connection as a second connection structure 2602. For clarity, FIG. 26 omits other layers and components that may be included in the connection structures 2600, 2602.

In the first connection structure 2600, an MD region 216 is disposed over an active diffusion region 208 (or active diffusion region 210). As described previously, an active diffusion region (e.g., active diffusion regions 208, 210 in FIG. 2) can include one or more fin structures that are disposed on a substrate (not shown) and serve as active regions of the transistors (e.g., field effect transistors) in a cell.

A conductive via-to-diffusion ("VD") region 2604 is disposed over the MD region 216. The VD region 2604 can connect the MD region 216 to a metal stripe 202 (e.g., metal stripe 202b) in the ML1 layer, where the ML1 layer is positioned over the VD region 2604. A contact 220 (e.g., contact 220a) is disposed over the metal stripe 202. A metal stripe 204 in the ML2 layer (e.g., metal stripe 204a) is positioned over the contact 220. The contact 220 provides a contact between the metal stripe 202 in the ML1 layer and the metal stripe 204 in the ML2 layer.

In the second connection structure 2602, a poly line 212 is disposed over the active diffusion region 208 (or active diffusion region 210). A conductive via-to-gate ("VG") region 2606 is disposed over the poly line 212. The VG region 2606 connects the poly line 212 (e.g., poly gate) to a metal stripe 202 (e.g., metal stripe 202d) in the ML1 layer, where the ML1 layer is positioned over the VG region 2606. A contact 220 (e.g., contact 220b) is disposed over the metal stripe 202. A metal stripe 204 in the ML2 layer (e.g., metal stripe 204b) is positioned over the contact 220. The contact 220 provides a contact between the metal stripe 202 in the ML1 layer and the metal stripe 204 in the ML2 layer.

FIG. 27 illustrates a first layout of the cell shown in FIG. 26 that is produced by a first design process in accordance with some embodiments. The layout 2700 includes a first active diffusion region 208 and a second active diffusion region 210 disposed in the x direction. In a non-limiting example, the first active diffusion region 208 a source/drain region for a p-type transistor and the second active diffusion region 210 is a source/drain region for an n-type transistor. A ML1 layer 202 is disposed in the x-direction over the first and the second active diffusion regions 208, 210. In particular, the ML1 layer 202 includes the metal stripes 202b, 202d.

The MD region 216 is positioned in the y direction over the first and the second active diffusion regions 208, 210. The VD region 2604 and the contact 220 are disposed over the MD region 216. The VD region 2604 is not visible in FIG. 27 because the VD region 2604 is below the contact 220. Although not shown in FIG. 27, a metal stripe 204 of the ML2 layer will be positioned over the contact 220.

The poly line 212 is positioned in the y direction over the first and the second active diffusion regions 208, 210. The VG region 2606 and the contact 220 are disposed over the poly line 212. The VG region 2606 is not visible in FIG. 27 because the VG region 2606 is below the contact 220. Although not shown in FIG. 27, a metal stripe 204 of the ML2 layer will be positioned over the contact 220.

Figure 28:
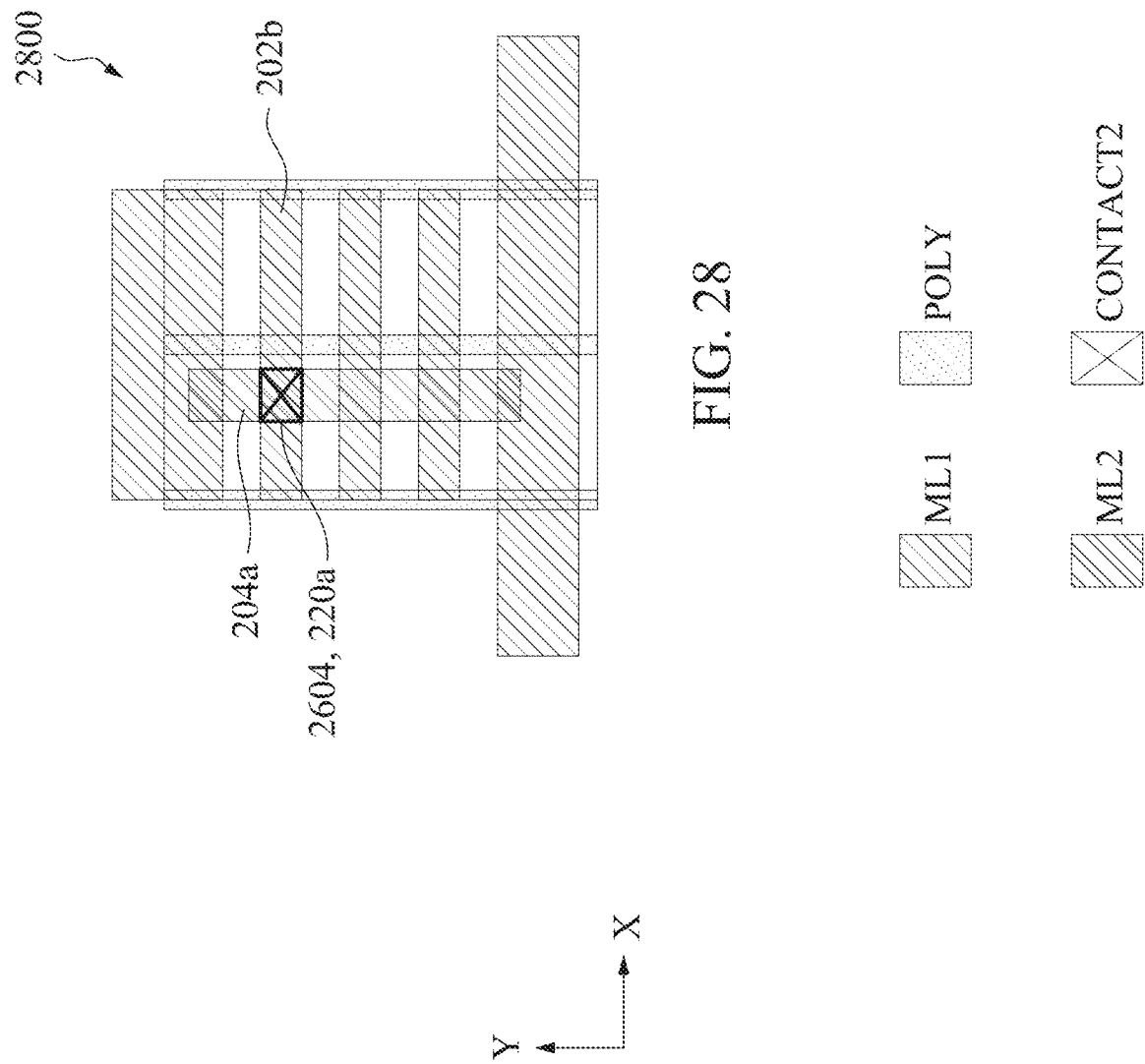
FIG. 28 illustrates a first layout of the cell shown in FIG. 26 that is produced by a first design process in accordance with some embodiments.

FIG. 28 depicts a second layout of the cell shown in FIG. 26 that is produced by a second design process in accordance with some embodiments. In a non-limiting example, the layout 2800 is produced by an electrical design automation tool. The layout 2800 includes the ML1 layer 202 (including the metal stripe 202b) disposed in the x direction, the ML2 layer 204 (including the metal stripe 204a) positioned in the y direction, the VD region 2604, and the contact 220 (e.g., contact 220a). The VD region 2604 is not visible in FIG. 28 because the VD region 2604 is below the contact 220.

Figure 29A:
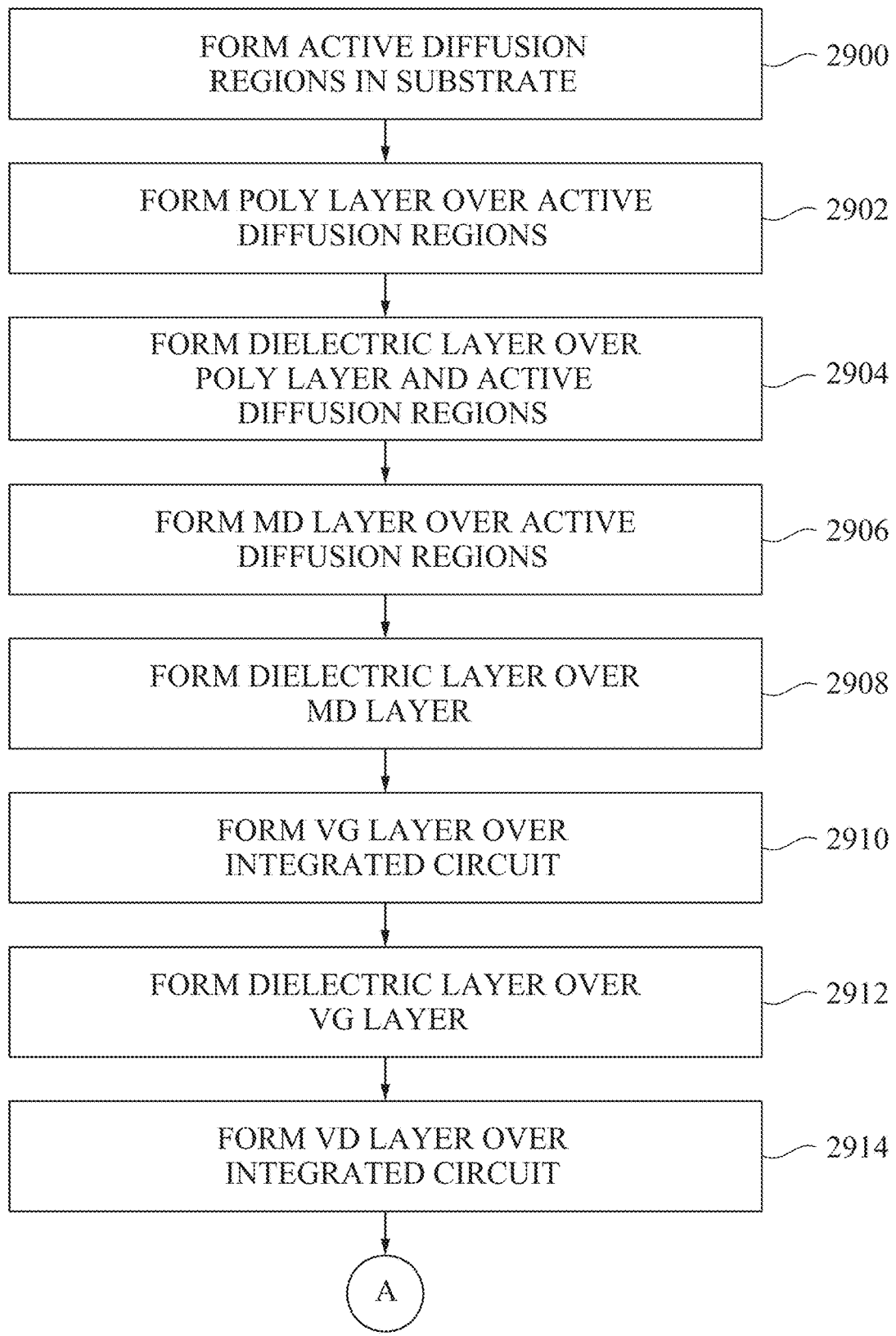
FIGS. 29A-29B depict a flowchart of an example method of fabricating an integrated circuit including the connections between the active diffusion regions in a substrate and a top metal layer in accordance with some embodiments.
Figure 29B:
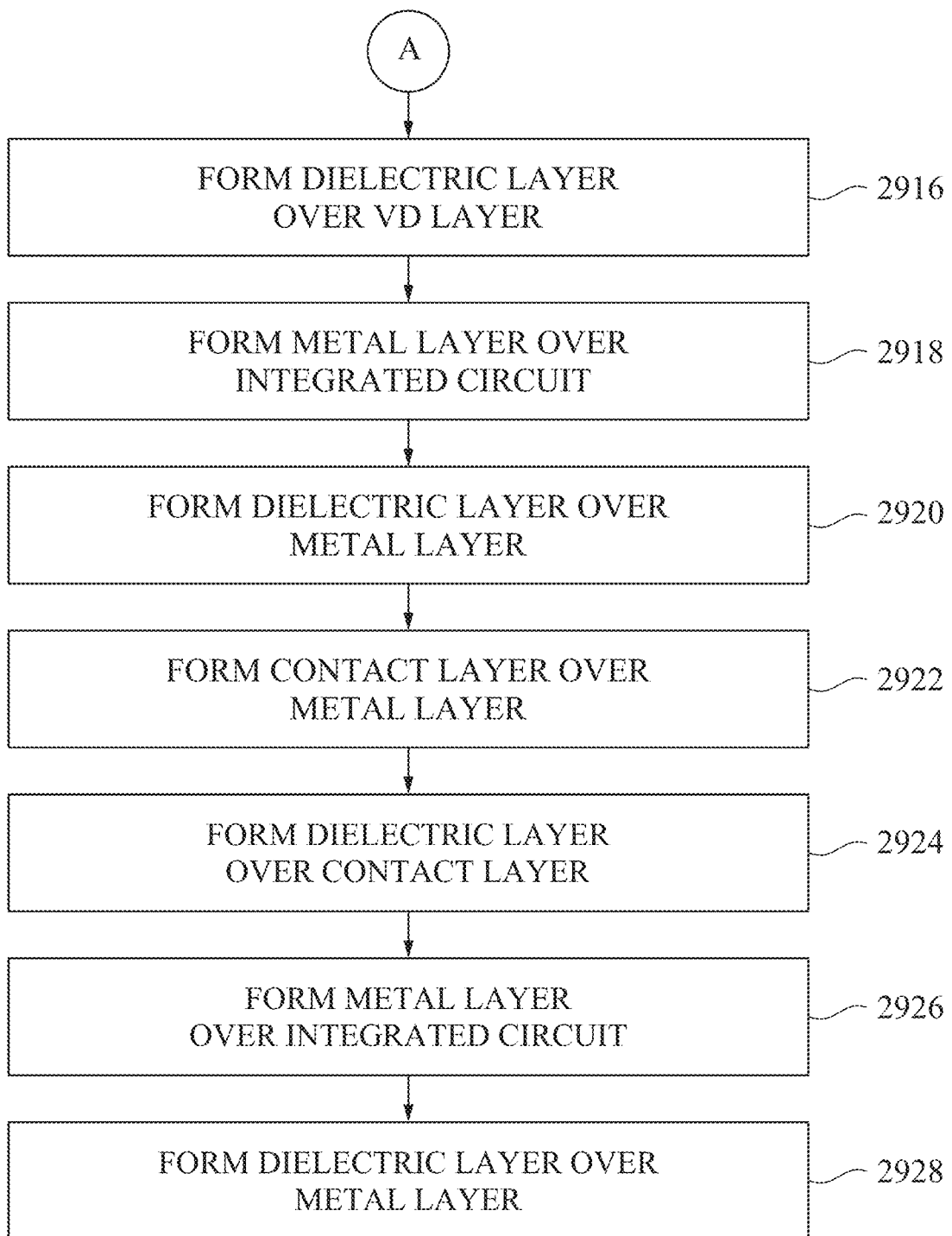

FIGS. 29A-29B depict a flowchart of an example method of fabricating an integrated circuit including the connections between the active diffusion regions in a substrate and a top metal layer in accordance with some embodiments. The illustrated process can be used to form the various layers in an integrated circuit, such as one or more metal layers, one or more VG layers, one or more MD layers, one or more VD layers, and the contacts. The method can be used for fabricate the first and the second connection structures 2600, 2602 shown in FIG. 26. The example method illustrated in FIGS. 29A-29B is described in conjunction with FIGS. 30A-30H. FIGS. 30A-30H depict blocks 2900, 2904, 2908, 2912, 2916, 2920, 2924, and 2928 shown in FIGS. 29A-29B.

Initially, as shown in block 2900, the active diffusion regions are formed in a substrate. As described earlier, the active diffusion regions include the source/drain regions for the transistors in an integrated circuit. In a non-limiting example, at least one active diffusion region is a source/drain region for one or more p-type transistors and at least one other active diffusion region is a source/drain region for one or more n-type transistors.

Figure 30A:
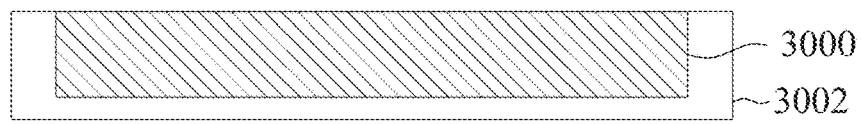
FIG. 30A illustrates block 2900 shown in FIG. 29A in accordance with some embodiments.

FIG. 30A shows an active diffusion region 3000 (e.g., active diffusion region 208 or 210) formed in a substrate 3002. The substrate 3002 can be any suitable type of a substrate. An example substrate includes, but is not limited to, a silicon substrate, a gallium arsenide substrate, a silicon-on-insulator substrate, a gallium nitride substrate, and a silicon carbide substrate. Additionally, any suitable method can be used to form the active diffusion regions. In a non-limiting example, the active diffusion regions are formed by implanting one or more n-type dopants and one or more p-type dopants into the substrate 3002.

A polysilicon ("poly") layer is formed over the active diffusion regions at block 2902. Any suitable method can be used to form the poly layer over the active diffusion regions. In an example embodiment, a mask layer is formed over the active diffusion regions and developed (e.g., etched) to produce openings that expose a surface of the substrate and define the locations of the poly lines to be formed over the active regions. The poly layer is then deposited over the mask layer and the polysilicon material fills the openings in the mask layer to produce the poly lines over the active diffusion regions in the substrate.

Figure 30B:
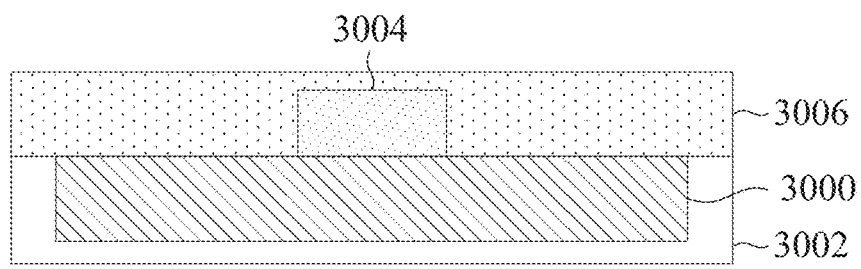
FIG. 30B depicts block 2904 shown in FIG. 29A in accordance with some embodiments.

A dielectric layer is formed over the poly layer and the active diffusion regions at block 2904. The dielectric layer electrically insulates the poly lines in the poly layer from each other. Any suitable method can be used to form the dielectric layer. For example, the dielectric layer may be deposited over the poly layer and the active diffusion regions. FIG. 30B shows a poly line 3004 in the poly layer formed over the active region 3000 and a dielectric layer 3006 formed over the poly line 3004 and the active diffusion region 3000. The poly line 3004 represents one or more poly lines. In some embodiments, the poly line 3004 is the poly lines 212 and 212a-212f (see e.g., FIGS. 2, 4-13C, 26, 27).

Next, as shown in block 2906, a MD layer is formed over the active diffusion regions. Any suitable method can be used to form the MD layer over the active diffusion regions. In a non-limiting example, a mask layer is formed over the dielectric layer and developed (e.g., etched) to produce openings that expose a surface of the substrate and define the locations of the MD regions to be formed over the active diffusion regions. The MD layer is then deposited over the mask layer and the material in the MD layer fills the openings in the mask layer to produce the MD regions over the active diffusion regions in the substrate.

Figure 30C:
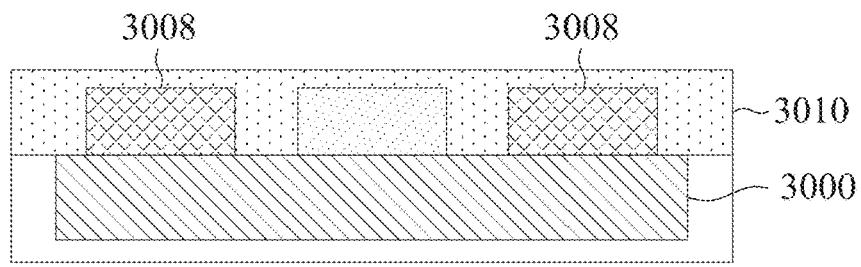
FIG. 30C illustrates block 2908 shown in FIG. 29A in accordance with some embodiments.

A dielectric layer is formed over the MD layer at block 2908. The dielectric layer electrically insulates the MD regions in the MD layer from each other. Any suitable method can be used to form the dielectric layer. For example, the dielectric layer may be deposited over the MD layer. FIG. 30C shows MD regions 3008 formed over the active region 3000 and a dielectric layer 3010 formed over the MD regions 3008. An integrated circuit can include one or more MD regions 3008. In some embodiments, the MD regions 3008 are the MD regions 214a-214i (see e.g., FIGS. 2, 6-8, 11A, 12A, 13A, 26, 27).

A VG layer is formed over the IC at block 2910. In some embodiments, the VG layer is formed over the poly layer at block 2910. Any suitable method can be used to form the VG layer over the IC (e.g., the poly layer). In an example embodiment, a mask layer is formed over the dielectric layer and developed (e.g., etched) to produce openings that expose a surface of the poly layer and define the locations of the VG regions to be formed over the poly lines in the poly layer. The VG layer is then deposited over the mask layer and the material in the VG layer fills the openings in the mask layer to produce the VG regions over the poly lines.

Figure 30D:
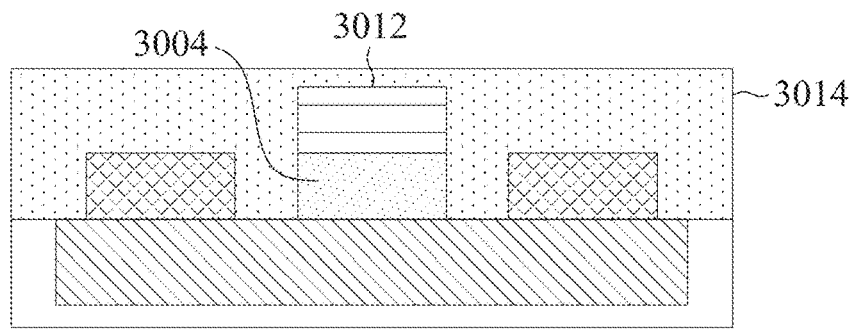
FIG. 30D depicts block 2912 shown in FIG. 29A in accordance with some embodiments.

A dielectric layer is formed over the VG layer at block 2912. The dielectric layer electrically insulates the VG regions in the VG layer from each other. Any suitable method can be used to form the dielectric layer. For example, the dielectric layer may be deposited over the VG layer. FIG. 30D shows a VG region 3012 formed over the poly line 3004 and a dielectric layer 3014 formed over the VG region 3012. An integrated circuit can include one or more VG regions 3012. In some embodiments, the VG region 3012 is the VG region 2606 shown in FIG. 26. Additionally or alternatively, one or more VG regions 3012 can be formed at locations other than the location in the connection structure 2602 (FIG. 26).

A VD layer is formed over the IC at block 2914. In some embodiments, the VD layer is formed over the MD layer at block 2914. Any suitable method can be used to form the VD layer over the IC (e.g., the MD layer). For example, a mask layer is formed over the dielectric layer and developed (e.g., etched) to produce openings that expose a surface of the MD layer and define the locations of the VD regions to be formed over the MD regions in the MD layer. The VD layer is then deposited over the mask layer and the material in the VD layer fills the openings in the mask layer to produce the VD regions over the MD regions.

A dielectric layer is formed over the VD layer at block 2916. The dielectric layer electrically insulates the VD regions in the VD layer from each other. Any suitable method can be used to form the dielectric layer. For example, the dielectric layer may be deposited over the VD layer. FIG. 30E shows the VD regions 3016 formed over the MD regions 3008 and a dielectric layer 3018 formed over the VD regions 3016. An integrated circuit can include one or more VD regions 3016. In some embodiments, a VD region 3016 is the VD region 2604 shown in FIG. 26. Additionally or alternatively, one or more VD regions 3016 can be formed at locations other than the location in the connection structure 2600 (FIG. 26).

A metal layer is formed over the IC at block 2918. In some embodiments, the metal layer is formed over the VD and VG layers at block 2918. Additionally or alternatively, one or more filler cells are formed when the metal layer is formed. Any suitable method can be used to form the metal layer over the IC (e.g., over the VD and VG layers). For example, a mask layer is formed over the dielectric layer and developed (e.g., etched) to produce openings that expose surfaces of the VD and VG layers and define the locations of the metal stripes to be formed over the VD and VG regions. The metal layer is then deposited over the mask layer and the conductive material in the metal layer fills the openings in the mask layer to produce the metal stripes over the VD and VG regions.

In some embodiments, at least one metal stripe in the metal layer is formed as disclosed herein. For example, in some embodiments, at least one metal stripe is fabricated to extend beyond the boundary of a cell as disclosed herein (e.g., power stripes 202a, 202e, 206e in FIG. 2, extensions 403, 404, 406 in FIG. 4). Additionally or alternatively, at least one metal stripe in the metal layer is formed into multiple metal segments as described herein (see e.g., 202e in FIG. 2, 418, 420, 422 in FIG. 4, and 2306 in FIG. 23). In some embodiments, at least one metal stripe in the metal layer is fabricated to extend across a filler cell as described herein (e.g., segment 1808' in FIGS. 18 and 19). In some embodiments, some of the metal stripes in the metal layer are formed in a combination of such embodiments. At least one of the metal segments and/or at least one of the extended metal stripes can be operably connected to a voltage source to provide a voltage signal (e.g., VDD or VSS).

A dielectric layer is formed over the metal layer at block 2920. The dielectric layer electrically insulates the metal stripes in the metal layer from each other. Any suitable method can be used to form the dielectric layer. For example, the dielectric layer may be deposited over the metal layer. FIG. 30F shows the metal stripes 3020 formed over the VG region 3012 and over the VD regions 3016 and a dielectric layer 3022 formed over the metal stripes 3020. An integrated circuit can include one or more metal stripes that are configured as signal lines and/or as power stripes. In some embodiments, the metal stripe 3020 is a metal stripe 202a-202e, 1402, 1804, 1806, 1808, 2102, 2306, 2406 (see e.g., FIGS. 2-5, 11A, 12A, 13A, 14A-B, 15, 16, 18, 21, 23, 24, and 26-28).

A contact layer is formed over the metal layer at block 2922. Any suitable method can be used to form the contact layer. For example, a mask layer is formed over the dielectric layer and developed (e.g., etched) to produce openings that expose a surface of the metal layer and define the locations of the contacts to be formed over the metal stripes. The contact layer is then deposited over the mask layer and the conductive material in the contact layer fills the openings in the mask layer to produce the contacts over the metal stripes.

A dielectric layer is formed over the contact layer at block 2924. The dielectric layer electrically insulates the contacts in the contact layer from each other. Any suitable method can be used to form the dielectric layer. For example, the dielectric layer may be deposited over the contact layer. FIG. 30G shows the contacts 3024 formed over the metal stripes 3020 and a dielectric layer 3026 formed over the contacts 3024. An integrated circuit can include one or more contacts 3024. In some embodiments, a contact is a contact 218, 220, 220a-220c, 222, 224, 224a-224d, 302, 304, 304a (see e.g., FIGS. 2, 3, 11A, 21, 22, and 26-28).

A metal layer is formed over the IC at block 2926. In some embodiments, the metal layer is formed over the contact layer at block 2926. Additionally or alternatively, one or more filler cells are formed when the metal layer is formed. Any suitable method can be used to form the metal layer over the IC (e.g., over the contact layer). For example, a mask layer is formed over the dielectric layer and developed (e.g., etched) to produce openings that expose the surface of the contact layer and define the locations of the metal stripes to be formed over the contacts. The metal layer is then deposited over the mask layer and the conductive material in the metal layer fills the openings in the mask layer to produce the metal stripes over the contacts.

In some embodiments, at least one metal stripe in the metal layer is formed as disclosed herein. For example, in some embodiments, at least one metal stripe is fabricated to extend beyond the boundary of a cell as disclosed herein. Additionally or alternatively, at least one metal stripe in the metal layer is formed into multiple metal segments as described herein. In some embodiments, at least one metal stripe in the metal layer is fabricated to extend across a filler cell and/or as a metal pillar as described herein. In some embodiments, one or more of the metal stripes in the metal layer are formed in a combination of two or more of the disclosed embodiments. In some embodiments, at least one metal segment and/or at least one extended metal stripe can be operably connected to a voltage source to provide a voltage signal (e.g., VDD or VSS). Additionally or alternatively, a metal pillar may be operably connected to a power stripe.

Figure 30H:
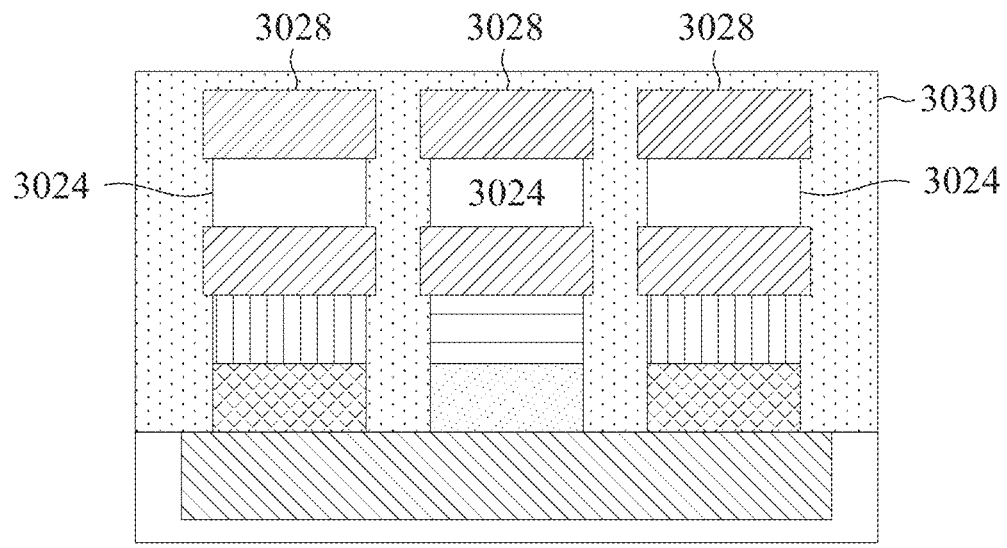
FIG. 30H depicts block 2928 shown in FIG. 29B in accordance with some embodiments.

A dielectric layer is formed over the metal layer at block 2928. The dielectric layer electrically insulates the metal stripes in the metal layer from each other. Any suitable method can be used to form the dielectric layer. For example, the dielectric layer may be deposited over the metal layer. FIG. 30H shows the metal stripes 3028 formed over the contacts 3024 and a dielectric layer 3030 formed over the metal stripes 3028. An integrated circuit can include one or more metal stripes that are configured as signal lines, as power stripes, and/or as metal pillars. In some embodiments, the metal stripe 3028 is a metal stripe 204, 204a-204d, 1410 (see e.g., FIGS. 2, 3, 6-8, 11A-11C, 12A-12C, 13A-13C, 16, 17, 21, 22, 26, and 28).

Although FIGS. 29A-30H depict a process that produces metal stripes in two metal layers (e.g., metal stripes 3020, 3028), other embodiments are not limited to two metal layers. Embodiments can form one or more metal layers in a connection structure. For example, each metal layer can be produced by forming a mask layer over an underlying layer (e.g., an underlying dielectric layer). The mask layer is developed (e.g., etched) to produce openings that expose the surface of the same or a different underlying layer (e.g., an underlying conductive or contact layer). The openings define the locations of the metal stripes to be formed over the underlying layer. The metal layer is then deposited over the mask layer and the conductive material in the metal layer fills the openings in the mask layer to produce the metal stripes in the metal layer.

In some embodiments, at least one metal stripe in one or more of the metal layers in the integrated circuit is formed as disclosed herein. For example, in some embodiments, at least one metal stripe is fabricated to extend beyond the boundary of a cell as disclosed herein. Additionally or alternatively, at least one metal stripe is formed into multiple metal segments as described herein. In some embodiments, at least one metal stripe is fabricated to extend across a filler cell and/or as a metal pillar as described herein. In some embodiments, one or more metal stripes are formed in a combination of two or more of the disclosed embodiments. In some embodiments, at least one metal segment and/or at least one of extended metal stripe can be operably connected to a voltage source to provide a voltage signal (e.g., VDD or VSS). Additionally or alternatively, at least one metal pillar may be operably connected to a power stripe.

In some embodiments, a design for an IC is provided by a computer system such as an Electronic Computer-Aided Design (ECAD) system. ECAD tools and methods facilitate the design, partition, and placement of circuits and/or components in an IC on a semiconductor substrate. The ECAD process typically includes turning a behavioral description of an IC into a functional description, which is then decomposed into logic functions and mapped into cells that implement the logic or other electronic functions. Such cells may be defined and stored in a cell library. Once mapped, a synthesis is performed to turn the structural design into a physical layout. In some instances, the design may be optimized post layout.

Figure 31:
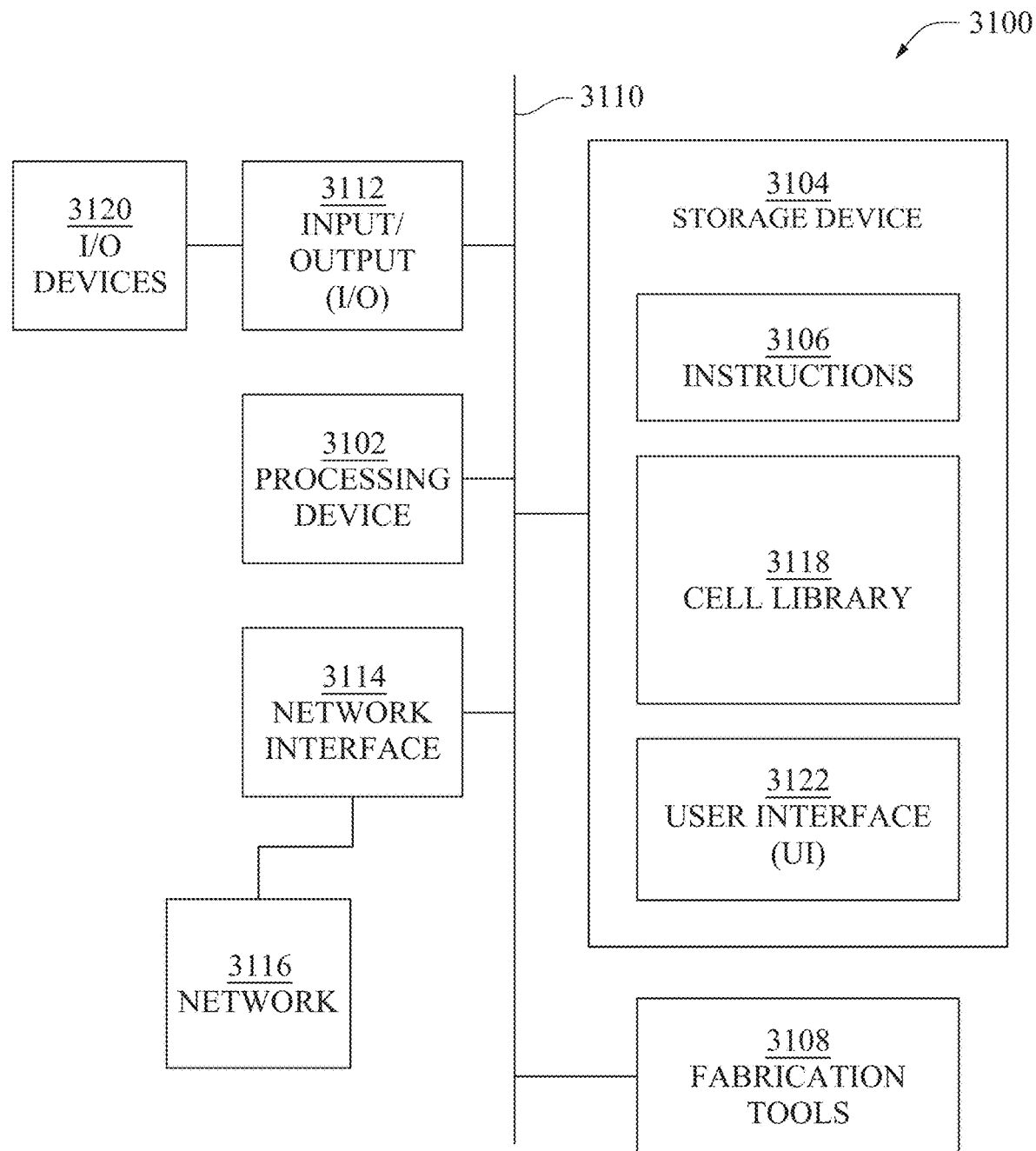
FIG. 31 illustrates an example system that is suitable for designing an integrated circuit in accordance with some embodiments.

FIG. 31 illustrates an example system that is suitable for designing an integrated circuit in accordance with some embodiments. The design process may be implemented by a computer system, such as an ECAD system. Some or all of the operations for design (e.g., layout) methods disclosed herein are capable of being performed as part of a design procedure performed in a design house, such as the design house 3202 discussed below in conjunction with FIG. 32.

In some embodiments, the system 3100 includes an automated place and route (APR) system. In some embodiments, the system 3100 includes a processing device 3102 and a non-transitory, computer-readable storage medium 3104 ("storage device"). The processing device 3102 is any suitable processing device or processing devices. Example processing devices include, but are not limited to, a central processing unit, a microprocessor, a distributed processing system, an application specific integrated circuit, a graphics processing unit, a field programmable gate array, or combinations thereof.

The storage device 3104 may be encoded with or store, for example, computer program code (e.g., a set of executable instructions 3106). Execution of the executable instructions 3106 by the processing device 3102 represents (at least in part) an ECAD tool that implements a portion or all of, the methods described herein to produce the designs for the structures and the ICs disclosed herein. Further, the fabrication tools 3108 may be included for layout and physical implementation of the ICs. In one or more embodiments, the storage device 3104 is a non-transitory electronic, magnetic, optical, electromagnetic, infrared, and/or a semiconductor system (or apparatus or device). For example, the storage device 3104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the storage device 3104 includes a compact disk-read only memory (CD-ROM), a compact disk-read/write (CD-R/W), and/or a digital video disc (DVD).

The processing device 3102 is operably connected to the storage device 3104 via a bus 3110. The processing device 3102 is also operably connected to an input/output (I/O) interface 3112 and a network interface 3114 by the bus 3110. The network interface 3114 is operably connected to a network 3116 so that the processing device 3102 and the storage device 3104 are capable of connecting to external elements via the network 3116. In one or more embodiments, the network 3116 is illustrative of any type of wired and/or wireless network, such as an intranet and/or a distributed computing network (e.g., the Internet).

The network interface 3114 allows the system 3100 to communicate with other computing or electronic devices (not shown) via the network 3116. The network interface 3114 includes wireless network interfaces and/or wired network interfaces. Example wireless network interfaces include BLUETOOTH, WIFI, WIMAX, GPRS, or WCDMA. Example wired network interfaces include ETHERNET, USB, or IEEE-1364. In one or more embodiments, some or all of the processes and/or methods disclosed herein are implemented in a distributed system via the network 3116.

The processing device 3102 is configured to execute the executable instructions 3106 encoded in the storage device 3104 to cause the system 3100 to be usable for performing some or all of the processes and/or methods described herein. For example, an electronic design application (e.g., in an ECAD system or as a standalone application) can be configured to perform the methods and techniques shown in FIGS. 2-30H. Given the complexity of integrated circuits, and since integrated circuits include thousands, millions, or billions of components, the human mind is unable to perform the methods and techniques depicted in FIGS. 2-30H. Unlike the human mind, an electronic design application is able to perform the operations associated with FIGS. 2-30H.

In one or more embodiments, the storage device 3104 stores the executable instructions 3106 configured to cause the system 3100 to be usable for performing some or all of the processes and/or methods. In one or more embodiments, the storage device 3104 also stores information that facilitates execution of a portion of or all of the processes and/or methods. In one or more embodiments, the storage device 3104 stores a cell library 3118 that includes (at least in part) standard and/or previously designed cells.

The I/O interface 3112 is operably connected to I/O devices 3120. In one or more embodiments, the I/O devices 3120 include one or more of an image capture device, a microphone, a scanner, a keyboard, a keypad, a mouse, a trackpad, a touchscreen, and/or cursor direction keys for communicating information and commands to the processing device 3102. The I/O devices 3120 may also include one or more displays, one or more speakers, a printer, headphones, a haptic or tactile feedback device, and the like.

The system 3100 is configured to receive information through the I/O interface 3112. The information received through the I/O interface 3112 includes one or more of instructions, data, design rules, cell libraries, and/or other parameters for processing by the processing device 3102. The information is transferred to the processing device 3102 via the bus 3110. The system 3100 is configured to receive information related to a user interface (UI) through the I/O interface 3112. The information is stored in the storage device 3104 as a UI 3122 or for presentation in the UI 3122.

In some embodiments, a portion or all of the processes and/or methods is implemented as a standalone software application (e.g., an EDA) for execution by a processing device (e.g., processing device 3102). In some embodiments, a portion or all of the processes and/or methods is implemented as a software application that is a part of an additional software application. In some embodiments, a portion or all of the processes and/or methods is implemented as a plug-in to a software application. In some embodiments, at least one of the processes and/or methods is implemented as a software application that is a portion of an EDA tool. In some embodiments, a portion or all of the processes and/or methods is implemented as a software application that is used by the system 3100. In some embodiments, a layout diagram which includes standard and/or previously designed cells is generated using a tool such as VIRTUOSO available from CADENCE DESIGN SYSTEMS, Inc., or another suitable layout generating tool.

In some embodiments, the processes are realized as functions of a program stored in a non-transitory computer readable recording medium (e.g., the storage device 3104). Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

As noted above, embodiments of the system 3100 may include the fabrication tools 3108 for implementing the processes and/or methods stored in the storage device 3104. For instance, a synthesis may be performed on a design in which the behavior and/or functions desired from the design are transformed to a functionally equivalent logic gate-level circuit description by matching the design to cells selected from the cell library 3118. The synthesis results in a functionally equivalent logic gate-level circuit description, such as a gate-level netlist. Based on the gate-level netlist, a photolithographic mask may be generated that is used to fabricate the IC by the fabrication tools 3108. Further aspects of device fabrication are disclosed in conjunction with FIG. 32, which is a block diagram of an integrated circuit manufacturing system, and a manufacturing flow associated therewith, in accordance with some embodiments. In some embodiments, based on a layout diagram, at least one of: (a) one or more semiconductor masks; or (b) at least one component in a layer of a semiconductor IC is fabricated using the manufacturing system 3200.

Figure 32:
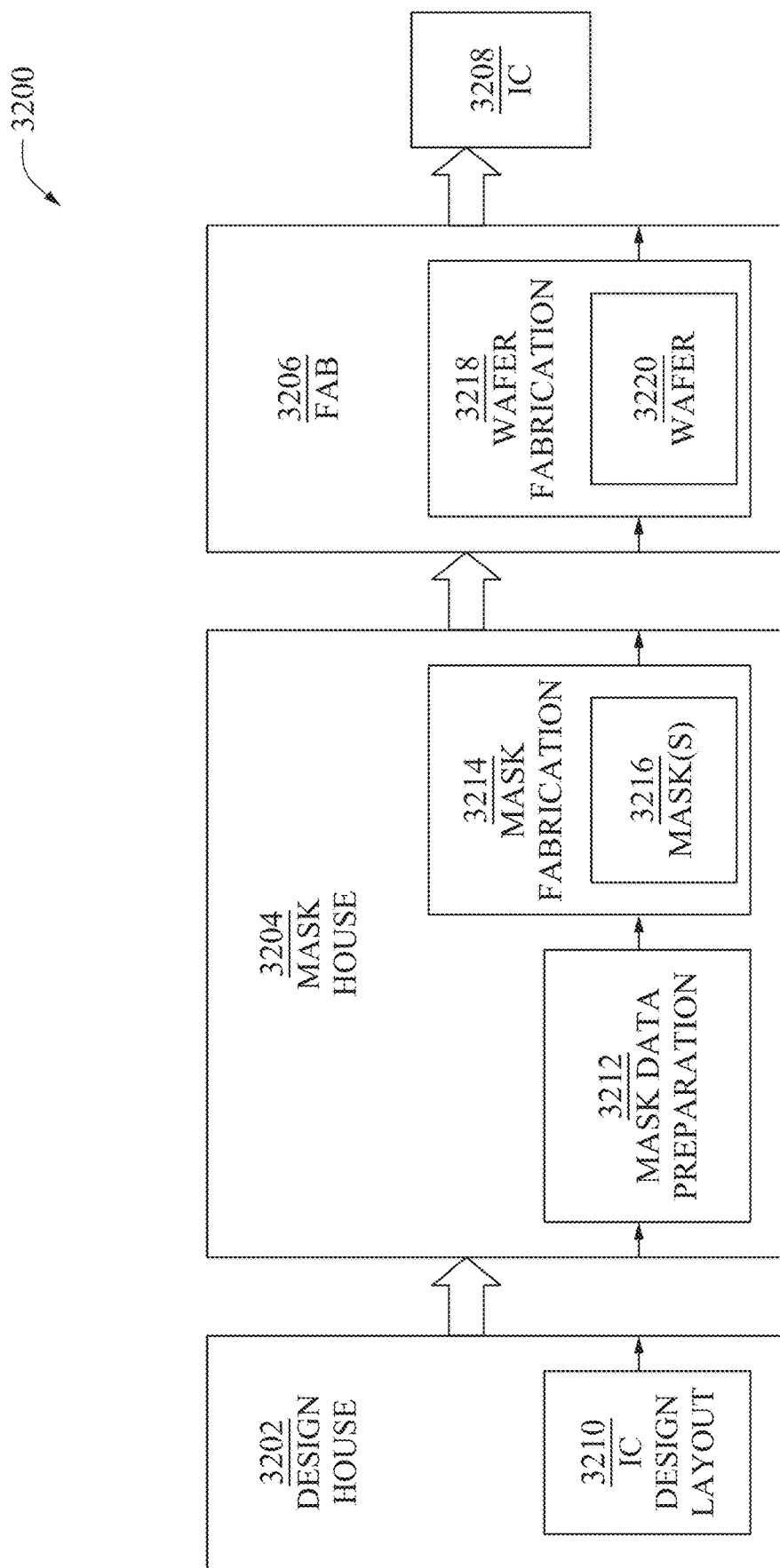
FIG. 32 depicts a block diagram of an example integrated circuit manufacturing system and manufacturing flow in accordance with some embodiments.

In the embodiment illustrated in FIG. 32, the IC manufacturing system 3200 includes entities, such as a design house 3202, a mask house 3204, and an IC manufacturer/fabricator ("fab") 3206, that interact with one another in the design, development, and manufacturing cycles and/or services related to manufacturing an IC 3208, such as the ICs disclosed herein. The entities in the system 3200 are operably connected by a communication network (not shown). In some embodiments, the communication network is a single network. In other embodiments, the communication network is a variety of different networks, such as an intranet and the Internet. The communication network includes wired and/or wireless communication channels.

Each entity interacts with one or more of the other entities and provides services to and/or receives services from one or more of the other entities. In some embodiments, two or more of the design house 3202, the mask house 3204, and the IC fab 3206 is owned by a single company. In some embodiments, two or more of the design house 3202, the mask house 3204, and the IC fab 3206 coexist in a common facility and use common resources.

The design house (or design team) 3202 generates an IC design layout diagram 3210. The IC design layout diagram 3210 includes various geometrical patterns, or IC layout diagrams designed for the IC 3208 to be fabricated. The geometrical patterns correspond to patterns of metal, oxide, or semiconductor layers that make up the various components of the IC 3208 to be fabricated. The various layers combine to form various IC features. For example, a portion of the IC design layout diagram 3210 includes various IC features, such as active regions, gate electrodes, source and drain, metal stripes or local vias, and openings for bonding pads, to be formed in a semiconductor substrate (such as a silicon wafer) and various material layers disposed on the semiconductor substrate.

The design house 3202 implements a design procedure to form the IC design layout diagram 3210. The design procedure includes one or more of logic design, physical design or place and route. The IC design layout diagram 3210 is presented in one or more data files having information of the geometrical patterns. For example, the IC design layout diagram 3210 can be expressed in a GDS file format, a GDSII file format, or a DFII file format.

The mask house 3204 includes mask data preparation 3212 and mask fabrication 3214. The mask house 3204 uses the IC design layout diagram 3210 to manufacture one or more masks 3216 to be used for fabricating the various layers of the IC 3208 according to the IC design layout diagram 3210. The mask house 3204 performs mask data preparation 3212, where the IC design layout diagram 3210 is translated into a representative data file ("RDF"). The mask data preparation 3212 provides the RDF to the mask fabrication 3214. The mask fabrication 3214 includes a mask writer (not shown) that converts the RDF to an image on a substrate, such as a mask (reticle) 3216 on a semiconductor wafer. The IC design layout diagram 3210 is manipulated by the mask data preparation 3212 to comply with particular characteristics of the mask writer and/or requirements of the IC fab 3206. In FIG. 32, the mask data preparation 3212 and the mask fabrication 3214 are illustrated as separate elements. In some embodiments, the mask data preparation 3212 and the mask fabrication 3214 can be collectively referred to as a mask data preparation.

In some embodiments, the mask data preparation 3212 includes an optical proximity correction (OPC) that uses lithography enhancement techniques to compensate for image errors, such as those that can arise from diffraction, interference, other process effects and the like. The OPC adjusts the IC design layout diagram 3210. In some embodiments, the mask data preparation 3212 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 3212 includes a mask rule checker (MRC) (not shown) that checks the IC design layout diagram 3210 that has undergone processes in OPC with a set of mask creation rules that contain certain geometric and/or connectivity restrictions to ensure sufficient margins, to account for variability in semiconductor manufacturing processes, and the like. In some embodiments, the MRC modifies the IC design layout diagram 3210 to compensate for limitations during the mask fabrication, which may undo part of the modifications performed by OPC in order to meet mask creation rules.

In some embodiments, the mask data preparation 3212 includes lithography process checking (LPC) (not shown) that simulates processing that will be implemented by the IC fab 3206 to fabricate the IC 3208. LPC simulates this processing based on the IC design layout diagram 3210 to create a simulated manufactured device, such as the IC 3208. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, and if the simulated device is not sufficiently close in shape to satisfy design rules, OPC and/or MRC are be repeated to further refine the IC design layout diagram 3210.

It should be understood that the above description of the mask data preparation 3212 has been simplified for the purposes of clarity. In some embodiments, the mask data preparation 3212 includes additional features such as a logic operation (LOP) to modify the IC design layout diagram 3210 according to manufacturing rules. Additionally, the processes applied to the IC design layout diagram 3210 during the mask data preparation 3212 may be executed in a variety of different orders.

After the mask data preparation 3212 and during the mask fabrication 3214, a mask 3216 or a group of masks 3216 are fabricated based on the IC design layout diagram 3210. In some embodiments, the mask fabrication 3214 includes performing one or more lithographic exposures based on the IC design layout diagram 3210. In some embodiments, an electron-beam (e-beam) or a mechanism of multiple e-beams is used to form a pattern on a mask(s) 3216 (photomask or reticle) based on the IC design layout diagram 3210. The mask(s) 3216 can be formed in various technologies. For example, in some embodiments, the mask(s) 3216 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of the mask(s) 3216 includes a transparent substrate (e.g., fused quartz) and an opaque material (e.g., chromium) coated in the opaque regions of the binary mask.

In another example, the mask(s) 3216 is formed using a phase shift technology. In a phase shift mask (PSM) version of the mask(s) 3216, various features in the pattern formed on the phase shift mask are configured to have a proper phase difference to enhance the resolution and imaging quality. In various examples, the phase shift mask can be attenuated PSM or alternating PSM. The mask(s) 3216 generated by the mask fabrication 3214 is used in a variety of processes. For example, a mask(s) 3216 is used in an ion implantation process to form various doped regions in the semiconductor wafer, in an etching process to form various etching regions in the semiconductor wafer, and/or in other suitable processes.

The IC fab 3206 includes wafer fabrication 3218. The IC fab 3206 is an IC fabrication business that includes one or more manufacturing facilities for the fabrication of a variety of different IC products. In some embodiments, the IC fab 3206 is a semiconductor foundry. For example, there may be a manufacturing facility for the front end fabrication of a plurality of IC products (FEOL fabrication), while a second manufacturing facility may provide the back end fabrication for the interconnection and packaging of the IC products (BEOL fabrication), and a third manufacturing facility may provide other services for the foundry business.

The IC fab 3206 uses the mask(s) 3216 fabricated by the mask house 3204 to fabricate the IC 3208. Thus, the IC fab 3206 at least indirectly uses the IC design layout diagram 3210 to fabricate the IC 3208. In some embodiments, a semiconductor wafer 3220 is fabricated by the IC fab 3206 using the mask(s) 3216 to form the IC 3208. In some embodiments, the IC fab 3206 includes performing one or more lithographic exposures based at least indirectly on the IC design layout diagram 3210. The semiconductor wafer 3220 includes a silicon substrate or other proper substrate having material layers formed thereon. The semiconductor wafer 3220 further includes one or more of various doped regions, dielectric features, multilevel interconnects, and the like (formed at subsequent manufacturing steps).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one aspect, a cell in an integrated circuit includes a first metal layer and a second metal layer overlying the first metal layer. The first metal layer includes a first power stripe that is configured to connect to a first voltage source to provide a first voltage signal and a metal stripe divided into multiple metal segments. The second metal layer includes a second power stripe that is configured to connect to a second voltage source to provide a second voltage signal. A first metal segment in the multiple metal segments in the first metal layer is electrically connected to the second power stripe in the second metal layer to provide the second voltage signal to the first metal layer in the cell.

In another aspect, an integrated circuit includes a first cell and a second cell adjacent the first cell. The first cell includes a first metal layer that comprises a first power stripe that is operable to connect to a first voltage source to supply a first voltage signal and a first metal stripe divided into multiple metal segments. A first metal segment in the multiple metal segments extends outside a cell boundary of the first cell and is operable to supply a second voltage source to the first metal layer in the first cell. The second cell comprises the first metal layer that includes the first power stripe that is operable to supply the first voltage source and a second metal stripe that is divided into multiple metal segments. A second metal segment in the multiple metal segments extends outside a cell boundary of the second cell and is operable to supply the second voltage source to the first metal layer in the second cell. The first metal segment and the second metal segment form one metal segment that resides between and in the first and the second cells.

In yet another aspect, an integrated circuit includes a first cell and a second cell adjacent the first cell. The first cell includes a first metal layer and a second metal layer overlying the first metal layer. The first metal layer includes a first power stripe that is operable to connect to a first voltage source to supply a first voltage signal and N metal stripes for signals. The second metal layer includes a second power stripe that is operable to connect to a second voltage source to supply a second voltage signal and M metal stripes for signals, where N is less than M. The second cell includes the first metal layer that comprises the first power stripe that supplies the first voltage signal, and the second metal layer includes the second power stripe that supplies the second voltage signal. A filler cell is disposed between the first and the second cells.

In another aspect, a method of fabricating an integrated circuit includes forming a first conductor layer over the integrated circuit and forming a contact layer overlying the first conductor layer. The first conductor layer includes a conductor stripe that is divided into multiple conductor segments and a first power stripe that is configured to provide a first voltage signal. A second conductor layer is formed overlying the contact layer. The second conductor layer includes a second power stripe that is configured to provide a second voltage signal. A contact in the contact layer electrically connects a first conductor segment in the multiple conductor segments to the second power stripe to provide the second voltage signal to the first conductor layer.

The description and illustration of one or more aspects provided in this application are not intended to limit or restrict the scope of the disclosure as claimed in any way. The aspects, examples, and details provided in this application are considered sufficient to convey possession and enable others to make and use the best mode of claimed disclosure. The claimed disclosure should not be construed as being limited to any aspect, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

What is claimed is:

1. A method of fabricating an integrated circuit, the method comprising:
   forming a first conductor layer over the integrated circuit, wherein the first conductor layer includes a conductor stripe that is divided into multiple conductor segments and a first power stripe that is configured to provide a first voltage signal;
   forming a contact layer overlying the first conductor layer; and
   forming a second conductor layer overlying the contact layer and comprising a second power stripe that is configured to provide a second voltage signal, and a metal pillar operably connected to an underlying conductor stripe or power stripe, wherein a contact in the contact layer electrically connects a first conductor segment in the multiple conductor segments to the second power stripe to provide the second voltage signal to the first conductor layer.

2. The method of claim 1, wherein the first conductor segment is formed to extend beyond a boundary of a cell in the integrated circuit.

3. The method of claim 1, further comprising:
   forming one or more active regions in a substrate;
   forming a poly layer over the one or more active regions, the poly layer comprising a poly line; and
   forming a metal-to-diffusion (MD) layer over the one or more active regions, the MD layer comprising a MD region.

4. The method of claim 3, further comprising:
   forming a via-to-diffusion (VD) layer over the MD layer, the VD layer comprising a VD region that is formed over the MD region;
   forming a via-to-gate (VG) layer over the poly layer, the VG layer comprising a VG region that is formed over the poly line, wherein the first conductor layer is formed over the VD and the VG layers.

5. The method of claim 1, wherein forming the first conductor layer over the integrated circuit comprises forming the first conductor layer over the integrated circuit, wherein the first conductor layer includes the conductor stripe that is divided into multiple conductor segments, the first power stripe that is configured to provide the first voltage signal, and a second conductor stripe that is configured as a signal line.

6. The method of claim 1, further comprising forming a third conductor layer between the first and the second conductor layers, the third conductor layer providing one or more contacts between the first and the second conductor layers.

7. A cell in an integrated circuit, comprising:
   a first conductor layer over the integrated circuit, wherein the first conductor layer includes a conductor stripe that is divided into multiple conductor segments and a first power stripe that is configured to provide a first voltage signal;
   a contact layer overlying the first conductor layer; and
   a second conductor layer overlying the contact layer and comprising a second power stripe that is configured to provide a second voltage signal, and a metal pillar operably connected to an underlying conductor stripe or power stripe, wherein a contact in the contact layer electrically connects a first conductor segment in the multiple conductor segments to the second power stripe to provide the second voltage signal to the first conductor layer.

8. The cell of claim 7, wherein the first conductor segment extends beyond a boundary of a cell in the integrated circuit.

9. The cell of claim 7, further comprising:
   one or more active regions in a substrate;
   a poly layer over the one or more active regions, the poly layer comprising a poly line; and
   a metal-to-diffusion (MD) layer over the one or more active regions, the MD layer comprising a MD region.

10. The cell of claim 9, further comprising:
    a via-to-diffusion (VD) layer over the MD layer, the VD layer comprising a VD region that is formed over the MD region;
    a via-to-gate (VG) layer over the poly layer, the VG layer comprising a VG region that is formed over the poly line, wherein the first conductor layer is formed over the VD and the VG layers.

11. The cell of claim 7, wherein the first conductor layer over the integrated circuit includes the conductor stripe that is divided into multiple conductor segments, the first power stripe that is configured to provide the first voltage signal, and a second conductor stripe that is configured as a signal line.

12. A method of fabricating an integrated circuit, comprising:
forming a first conductor layer comprising a conductor stripe divided into multiple conductor segments and a first power stripe that is configured to connect to a first voltage source to provide a first voltage signal;
forming a second conductor layer overlying the first conductor layer and comprising a second power stripe and one or more conductor pillars, wherein the second power stripe is configured to connect to a second voltage source to provide a second voltage signal, wherein a first conductor segment in the multiple conductor segments is electrically connected to the second power stripe to provide the second voltage signal to the first conductor layer in the cell, and wherein each conductor pillar is electrically connected to the first power stripe; and
forming a third conductor layer that is separate from the first and second conductor layers disposed between the first and the second conductor layers, the third conductor layer providing one or more contacts between the first and the second conductor layers.

13. The method of claim 12, further comprising forming a second conductor segment in the multiple conductor segments in the first conductor layer that is configured as a signal line.

14. The method of claim 12, wherein the first power stripe is formed to extend outside a boundary of the cell.

15. The method of claim 14, wherein the first power stripe is shared by an adjacent cell that abuts the cell.

16. The method of claim 12, wherein the second power stripe is formed to extend outside a boundary of the cell.

17. The method of claim 16, wherein the second power stripe is shared by an adjacent cell that abuts the cell.

18. The method of claim 12, further comprising:
forming a first active diffusion region below the first conductor layer; and
forming a second active diffusion region below the first conductor layer.

19. The method of claim 18, further comprising:
forming one or more metal-to-diffusion (MD) regions over the first and the second active diffusion regions; and
forming one or more poly lines over the first and the second active diffusion regions.

20. The method of claim 12, wherein a cell height of the cell is in a range of approximately one hundred to one hundred and thirty nanometers.

* * * * *